(12) United States Patent
Yanai et al.

(10) Patent No.: US 7,977,670 B2
(45) Date of Patent: Jul. 12, 2011

(54) ORGANIC TRANSISTOR

(75) Inventors: Hiroyuki Yanai, Tokyo (JP); Shuichi Kimura, Tokyo (JP); Kiyoshi Yase, Tsukuba (JP); Yuji Yoshida, Tsukuba (JP); Masayuki Chikamatsu, Tsukuba (JP)

(73) Assignee: Toyo Ink Mfg. Co., Ltd., Tokyo (JP)

( * ) Notice: Subject to any disclaimer, the term of this patent is extended or adjusted under 35 U.S.C. 154(b) by 236 days.

(21) Appl. No.: 12/445,308

(22) PCT Filed: Oct. 12, 2006

(86) PCT No.: PCT/JP2006/320386
§ 371 (c)(1),
(2), (4) Date: Apr. 13, 2009

(87) PCT Pub. No.: WO2008/044302
PCT Pub. Date: Apr. 17, 2008

(65) Prior Publication Data
US 2010/0032657 A1 Feb. 11, 2010

(51) Int. Cl.
*H01L 35/24* (2006.01)
*H01L 51/00* (2006.01)
(52) U.S. Cl. ........................... 257/40; 438/99
(58) Field of Classification Search .................. 257/40; 438/99
See application file for complete search history.

(56) References Cited

U.S. PATENT DOCUMENTS

| | | | |
|---|---|---|---|
| 4,579,949 A | 4/1986 | Rochat et al. | |
| 6,875,996 B2 * | 4/2005 | Nakamura | 257/40 |
| 2004/0009368 A1 | 1/2004 | Otani et al. | |

FOREIGN PATENT DOCUMENTS

| | | |
|---|---|---|
| JP | 58 210084 | 12/1983 |
| JP | 4 500935 | 2/1992 |
| JP | 2001 94107 | 4/2001 |
| JP | 2001 139940 | 5/2001 |
| JP | 2002 512247 | 4/2002 |
| JP | 2002 198539 | 7/2002 |
| JP | 2004 536177 | 12/2004 |

OTHER PUBLICATIONS

Chen, X. Linda et al., "Ion-modulated ambipolar electrical conduction in thin-film transistors based on amorphous conjugated polymers", Applied Physics Letters, vol. 78, No. 2, (pp. 228-230, (2001).
Herwig, Peter T. et al., "A Soluble Pentacene Precursor: Synthesis, Solid-State Conversion into Pentacene and Application in a Field-Effect Transistor", Adanced Materials, vol. 11, No. 6, pp. 480-483, (1999).

* cited by examiner

*Primary Examiner* — Thien F Tran
(74) *Attorney, Agent, or Firm* — Oblon, Spivak, McClelland, Maier & Neustadt, L.L.P.

(57) ABSTRACT

An organic transistor having a source electrode, a drain electrode, a gate electrode, and an organic semiconductor layer, wherein the organic semiconductor layer comprises a compound represented by the following general formula [1] or [3]:

General Formula [1]

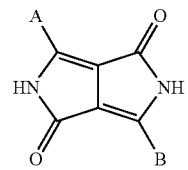

[Chemical formula 1]

wherein A and B independently represent a substituted or unsubstituted alkyl group, a substituted or unsubstituted heterocyclic group, or a substituted or unsubstituted aryl group.

General Formula [3]

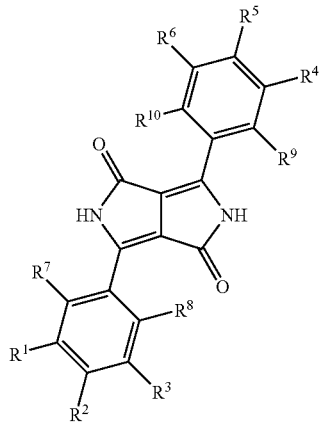

[Chemical formula 2]

wherein $R^1$ to $R^{10}$ are independently a hydrogen atom, a halogen atom, an alkyl group which has 4 or less carbon atoms and may be substituted with a halogen atom, an alkoxyl group which has 4 or less carbon atoms and may be substituted with a halogen atom, an amino group which has 4 or less carbon atoms and may be substituted with a halogen atom, a nitro group, or a cyano group, and the compound contains at least one halogen atom.

11 Claims, 2 Drawing Sheets

ORGANIC TRANSISTOR

TECHNICAL FIELD

The present invention relates to an organic thin film transistor formed by the use of an organic semiconductor.

BACKGROUND ART

Field effect transistors (FETs) have widely been used as important switching devices or amplifying devices as well as bipolar transistors. Hitherto, transistors using silicon, and others have been put into practice, and applied to wide fields. A field effect transistor exhibits characteristics thereof by controlling the transportation of carriers in its semiconductor layer present between its source electrode and its drain electrode by the use of its gate electrode with an insulating layer interposed therebetween. The field effect transistor is called an n type in a case where the carriers are electrons, and called a p type in a case where the carriers are holes (a monopolar device). In contrast to the monopolar device, the field effect transistor capable of transporting both of electrons and holes is called a bipolar device.

In particular, devices wherein a metal oxide is used in an insulating layer, which are called MOS (metal oxide semiconductor) structures, are widely applied to logical gate devices, inverter circuits, memory devices, and others. Of the devices, well known are MOS-FETs having a thermally oxidized film of silicon dioxide on silicon.

About inorganic semiconductor devices, a typical example of which is Si, highly complicated producing steps are repeated many times; thus, enormous costs are required for the production thereof. Moreover, the production includes a step of high-temperature treatment; therefore, it is difficult to use a flexible plastic substrate or an organic semiconductor. In comparison thereto, in the case of organic transistors, an device using a plastic substrate can be produced. Thus, the organic transistors are expected as flexible and light transistors.

In recent years, attention has been paid to devices wherein organic material is used in an active layer, such as organic ELs, organic lasers, organic solar cells, and organic transistors. Advantages based on the use of organic material include advantages that various materials can be designed and many added values can be given. In the case of giving an organic transistor as an example, the following advantages are mentioned: high temperature treatment, which is essential for conventional Si processes, is not required; therefore, organic transistor can be fabricated on a plastic substrate, and added values that the transistor is flexible and light and is not easily broken can be given. Moreover, the production process can be made very simple and easy, and a semiconductor material soluble in a solvent can be yielded in accordance with material design. This makes it possible to apply thereto a printing process such as screen printing or inkjet printing. Thus, from the viewpoint of productivity and costs, organic semiconductors are very advantageous as compared with inorganic semiconductors.

The operation characteristics of field effect transistors are largely relative to the electrostatic capacity of their insulating layer, their device structures (channel length and channel width), and the carrier mobility of their semiconductor layer. In organic semiconductor materials, the development of materials having a high mobility has been actively made. Additionally, the development of organic semiconductor materials high in stability has also become important since there has been caused a problem of deterioration in device characteristics based on a change with the passage of time.

Patent Document 1: Japanese Patent Application Laid-Open No. 2001-94107
Patent Document 2: Japanese Patent Application Laid-Open No. 2002-198539
Non-Patent Document 1: Applied Physics Letters, 2001, vol. 78, p. 228
Non-Patent Document 2: Advanced Materials, 1999, vol. 11, p. 480

DISCLOSURE OF THE INVENTION

An object of the invention is to provide an organic transistor that the device can be more simply and easily produced than inorganic semiconductor devices and further transistor characteristics are stable for a long term and a producing process thereof.

The invention relates to an organic transistor having a source electrode, a drain electrode, a gate electrode, and an organic semiconductor layer, wherein the organic semiconductor layer comprises a compound represented by the following general formula [1]:

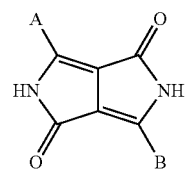

[Chemical formula 1]

wherein A and B independently represent a substituted or unsubstituted alkyl group, a substituted or unsubstituted heterocyclic group, or a substituted or unsubstituted aryl group.

The invention also relates to the organic transistor wherein A and B are independently represented by the following general formula [2]:

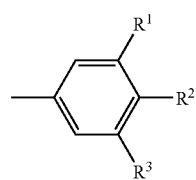

[Chemical formula 2]

wherein $R^1$ to $R^3$ independently represent a hydrogen atom, a halogen atom, a substituted or unsubstituted alkyl group, a substituted or unsubstituted heterocyclic group, a substituted or unsubstituted aryl group, a substituted or unsubstituted alkoxy group, a substituted or unsubstituted heterocyclic oxy group, a substituted or unsubstituted aryloxy group, an alkylthio group, an arylthio group, a heterocyclic thio group, an alkylsulfonyl group, an arylsulfonyl group, a heterocyclic sulfonyl group, or a substituted or unsubstituted amino group; and substituents of $R^1$ to $R^3$ may be bonded to each other to form a cycloalkyl ring, a heterocyclic ring, or an aromatic hydrocarbon ring.

The invention also relates to the organic transistor having a source electrode, a drain electrode, a gate electrode, and an organic semiconductor layer, wherein the organic semiconductor layer comprises a compound represented by the following general formula [3]:

[Chemical formula 3]

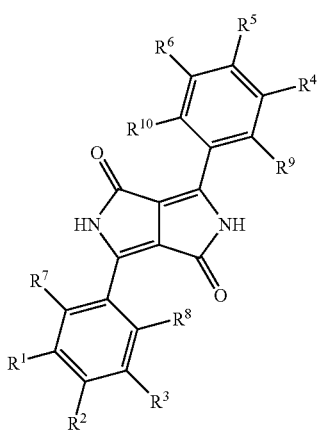

wherein $R^1$ to $R^{10}$ are independently a hydrogen atom, a halogen atom, an alkyl group which has 4 or less carbon atoms and may be substituted with a halogen atom, an alkoxy group which has 4 or less carbon atoms and may be substituted with a halogen atom, an amino group which has 4 or less carbon atoms and may be substituted with a halogen atom, a nitro group, or a cyano group, and the compound contains at least one halogen atom.

The invention also relates to the organic transistor wherein R7 to $R^{10}$ are independently a hydrogen atom, or a halogen atom.

The invention also relates to the organic transistor wherein the halogen atom is a fluorine atom.

The invention also relates to the organic transistor having the source electrode, the drain electrode, the gate electrode, and the organic semiconductor layer, wherein the organic semiconductor layer is formed by vacuum vapor-deposition at a vapor-deposition rate of 1 nm/sec or less.

The invention also relates to the organic transistor further having a gate insulating film.

Furthermore, the invention relates to a process for producing an organic transistor having a source electrode, a drain electrode, a gate electrode, and an organic semiconductor layer, including the step of subjecting a compound represented by the general formula [1] or [3] to vacuum vapor-deposition or spin coating, thereby forming an organic semiconductor layer.

The invention also relates to the process for producing an organic transistor wherein the organic semiconductor layer is formed by the vacuum vapor-deposition wherein the rate of the vapor-deposition is set to 1 nm/sec or less.

The invention also relates to the process for producing an organic transistor wherein $R^7$ to $R^{10}$ are independently a hydrogen atom or a halogen atom.

The invention also relates to the process for producing an organic transistor wherein the halogen atom is a fluorine atom.

The invention also relates to the process for producing an organic transistor wherein the transistor further has a gate insulating film.

REFERENCE SYMBOLS

Figure 1:
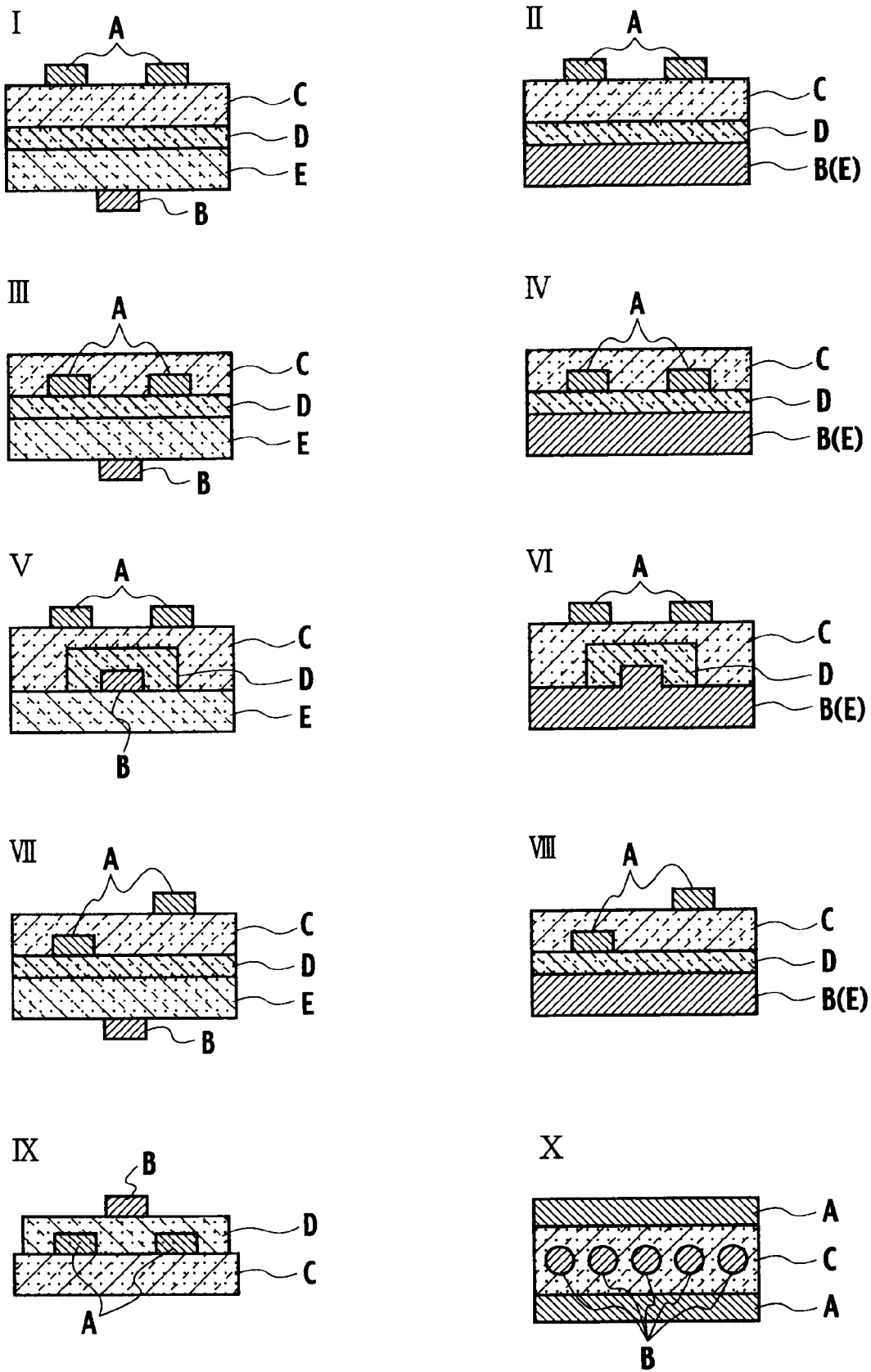
FIG. 1 shows conception diagrams illustrating an embodiment of the structure of the organic transistor of the invention.

A source electrode(s) or drain electrode(s)
B gate electrode(s)
C organic semiconductor layer
D gate insulating layer
E substrate

BEST MODE FOR CARRYING OUT THE INVENTION

The invention is characterized in that an organic semiconductor layer which is one of constituting elements of a transistor contains a compound represented by the following general formula [1]:

[Chemical formula 4]

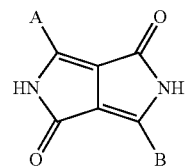

wherein A and B independently represent a substituted or unsubstituted alkyl group, a substituted or unsubstituted heterocyclic group, or a substituted or unsubstituted aryl group.

The invention also relates to the organic transistor wherein A and B in the general formula [1] are independently represented by the following general formula [2]:

[Chemical formula 5]

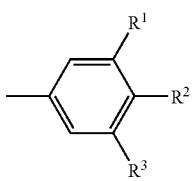

wherein $R^1$ to $R^3$ independently represent a hydrogen atom, a halogen atom, a substituted or unsubstituted alkyl group, a substituted or unsubstituted heterocyclic ring, a substituted or unsubstituted aryl group, a substituted or unsubstituted alkoxy group, a substituted or unsubstituted heterocyclic oxy group, a substituted or unsubstituted aryloxy group, an alkylthio group, an arylthio group, a heterocyclic thio group, an alkylsulfonyl group, an arylsulfonyl group, a heterocyclic sulfonyl group, or a substituted or unsubstituted amino group; and substituents of $R^1$ to $R^3$ may be bonded to each other to form a cycloalkyl ring, a heterocyclic ring, or an aromatic hydrocarbon ring.

A and B in the compound represented by the general formula [1] in the invention independently represent a substituted or unsubstituted alkyl group, a substituted or unsubstituted heterocyclic group, or a substituted or unsubstituted aryl group.

$R^1$ to $R^3$ in the compound represented by the general formula [2] in the invention independently represent a hydrogen atom, a halogen atom, a substituted or unsubstituted alkyl group, a substituted or unsubstituted heterocyclic ring, a substituted or unsubstituted aryl group, a substituted or unsubstituted alkoxy group, a substituted or unsubstituted heterocyclic oxy group, a substituted or unsubstituted aryloxy group, an alkylthio group, an arylthio group, a heterocyclic thio group, an alkylsulfonyl group, an arylsulfonyl group, a heterocyclic sulfonyl group, or a substituted or unsubstituted amino group; and substituents of $R^1$ to $R^3$ may be bonded to each other to form a cycloalkyl ring, a heterocyclic ring, or an aromatic hydrocarbon ring.

The substituted or unsubstituted alkyl group in the invention may be a linear or branched alkyl group such as a methyl, ethyl, propyl, butyl, sec-butyl, tert-butyl, pentyl, hexyl, heptyl, octyl, stearyl, 2-phenylisopropyl, trichloromethyl, trifluoromethyl, benzyl, α-phenoxybenzyl, α,α-dimethylbenzyl, α,α-methylphenylbenzyl, α,α-ditrifluoromethylbenzyl, triphenylmethyl, or α-benzyloxybenzyl group. The cyclic alkyl group (cycloalkyl ring) may be a cyclobutyl, cyclopentyl, cyclohexyl, cycloheptyl or cyclooctyl group, or any other cycloalkyl group.

The heterocyclic group in the invention may be a heterocyclic group in a monocyclic form, or a heterocyclic group in a condensed polycyclic form.

Examples of the monocyclic-form heterocyclic group include thienyl, furyl, pyrrolyl, imidazolyl, pyrazolyl, pyridyl, pyrazinyl, pyrimidinyl, pyridazinyl, triazinyl, triazolyl, oxazolyl, thiazolyl, oxadiazolyl, thiadiazolyl, and imidadiazolyl groups.

Examples of the condensed-polycyclic-form heterocyclic group include indolyl, quinolyl, isoquinolyl, phthalazinyl, quinoxalinyl, quinazolinyl, carbazolyl, acridinyl, phenazinyl, benzofuryl, isothiazolyl, isoxazolyl, furazanyl, phenoxazinyl, benzothiazolyl, benzooxazolyl, benzoimidazolyl, benzotriazolyl, and pyranyl groups. Other examples of the condensed polycyclic group include 1-tetralyl, 2-tetralyl, and tetrahydroquinolyl groups.

The aryl group may be a monocyclic aryl group or a condensed polycyclic aryl group.

An example of the monocyclic aryl group is a phenyl group.

Examples of the condensed polycyclic aryl group include naphthyl, anthryl, phenanthryl, fluorenyl, acenaphthyl, azulenyl, heptalenyl, pyrenyl, perylenyl, and triphenylenyl groups.

In the invention, the heterocyclic group or aryl group may be a group wherein two or more heterocyclic groups (monocyclic-form heterocyclic groups or condensed-polycyclic-form heterocyclic groups) and/or aryl groups (monocyclic aryl groups or condensed polycyclic aryl groups) are linked with each other via one or more non-aromatic-ring structural units containing one or more atoms selected from carbon, hydrogen, oxygen, nitrogen and sulfur atoms.

The non-aromatic-ring structural unit containing one or more atoms selected from carbon, hydrogen, oxygen, nitrogen and sulfur atoms is a linear, branched or cyclic unit having a bivalence or higher valence, and containing no aromatic ring (heterocyclic group nor aryl group). The unit preferably has 1 to 40 atoms. Examples of the non-aromatic-ring structural unit include oxygen and sulfur atoms; and carbonyl, sulfonyl, sulfinyl, alkyl, alkenyl, alkyloxy, alkylthio, cycloalkyl, amino, alkylamino groups, and other residues.

In a case where heterocyclic rings or aryl groups are linked with each other directly or via a non-aromatic-ring structural unit, the number of the heterocyclic rings or aryl groups is from 2 to 10. Each of the heterocyclic rings or aryl groups may be bonded at its two or more sites. The heterocyclic rings or aryl groups may be a condensed-polycyclic-form heterocyclic group or a condensed polycyclic aryl group, and their monocycle and their condensed ring may be bonded to each other.

Examples of one or more substituents which the heterocyclic group or aryl group has include halogen atoms; and alky, alkoxy, aryl, aryloxy, heterocyclic oxy, sulfonyl, amino, and cyano groups. The substituents may be bonded to each other to form a ring.

Specifically, the group wherein two or more heterocyclic groups or aryl groups are bonded directly to each other is, for example, a residue having a structure of binaphthyl, biquinoline, flavone, phenyltriazine, bisbenzothiazol, bithiophene, thienylbenzene, phenylbenzotriazole, phenylbenzimidazole, phenylacridine, bis(benzooxazolyl)thiophene, bis(phenyloxazolyl)benzene, biphenylylphenyloxadiazole, diphenylbenzoquinone, diphenylisobenzofurane, diphenylpyridine, dibenzyl, or diphenylfluorene.

The group wherein two or more heterocyclic groups or aryl groups are bonded to each other via a non-aromatic-ring structural unit therebetween is, for example, a residue having a structure of dibenzyl naphthyl ketone, dibenzilidenecyclohexanone, stylbene, distyrylnaphthalene, (phenylethyl)benzylnaphthalene, diphenyl ether, dimethyldiphenylamine, benzophenone, phenyl benzoate, diphenylurea, diphenylsulfide, diphenylsulfone, diphenoxybiphenyl, bis(phenoxyphenyl)sulfone, diphenylmethane, bis(phenylisopropyl)benzene, bis(phenoxyphenyl)propane, diphenylhexafluoropropane, diphenoxybenzene, ethylene glycol diphenyl ether, neopentyl glycol diphenyl ether, dipicolylamine, dipyridylamine, or triphenylamine.

The condensed polycyclic aryl group is preferably a condensed polycyclic aryl group having 10 to 40 carbon atoms, or a group wherein 2 to 10 aryl groups including at least one condensed polycyclic aryl group having 10 to 40 carbon atoms are linked directly to each other. Specific examples thereof include naphthalene, anthracene, phenanthrene, fluorene, pyrene, chrysene, naphthacene, pentacene, perylene, azulene, coronene, rubicene, decacyclene, 1,1-binaphthalene, and 9,9-bianthracene.

Specific examples of the halogen atoms include fluorine, chlorine, bromine, and iodine.

Examples of the substituted or unsubstituted alkoxy group include methoxy, ethoxy, propoxy, n-butoxy, tert-butoxy, hexyloxy, n-octyloxy, tert-octyloxy, 2,2,2-trifluoroethoxy, and benzyloxy groups.

Examples of the substituted or unsubstituted aryloxy group include phenoxy, biphenyloxy, naphthoxy, binaphthyloxy, methylphenoxy, dihexylphenoxy, diphenylaminophenoxy, octylphenoxy, cyanonaphthoxy, and chloroanthranyloxy groups.

Examples of the substituted or unsubstituted heterocyclic oxy group include thienyloxy, furyloxy, pyrroleoxy, bithienyloxy, quinolyloxy, phenylthienyloxy, pyridyloxy, and thienothienyloxy groups.

Examples of the substituted or unsubstituted amino group include amino, dimethylamino, diethylamino, N-methyl-N-phenylamino, diphenylamino, ditolylamino, and dibenzylamino groups.

The substituents may be bonded to each other to form a substituted or unsubstituted cyclopentene, cyclohexene, phenyl, naphthalene, anthracene, pyrene, fluorene, furan, thiophene, pyrrole, oxazole, thiazole, imidazole, pyridine, pyrazine, pyrroline, pyrazoline, indole, quinoline, quinoxaline, xanthene, carbazole, acridine or phenanthroline ring, or the like.

Typical examples of the compound of the general formula [1] in the invention are specifically illustrated as exemplified compounds (1) to (71); however, the compound is not limited thereto. In the exemplified compounds, Me, Et and Hex represent a methyl group, an ethyl group, and a hexyl group, respectively.

The exemplified compounds may be synthesized in accordance with synthesizing methods disclosed in, for example, U.S. Pat. No. 4,579,949.

In the invention, for example, the exemplified compound (1) is synthesized as follows:

Into 500 g of amyl alcohol were dissolved 11.4 g of dimethyl succinate, 30.1 g of 3-chlorobenzonitrile, and 21.1 g of sodium butoxide, and then the solution was refluxed for 6 hours. The solution was cooled, and then the precipitation was filtrated and washed with acetic acid and methanol to yield 30.3 g of the exemplified compound (1).

[Chemical formula 6]

(1)
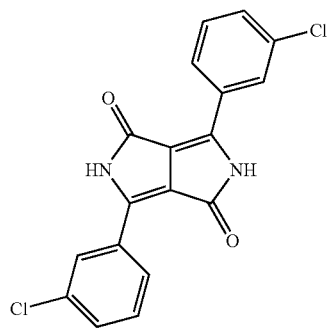

(2)
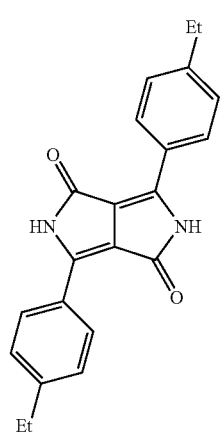

(3)
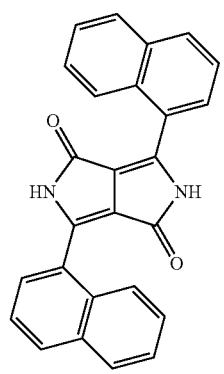

-continued (4)
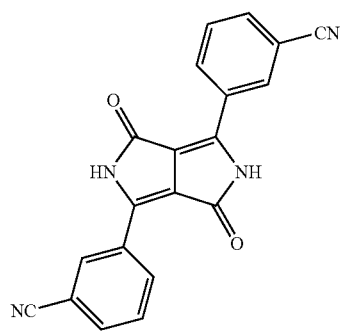

(5)
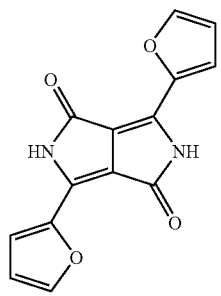

(6)
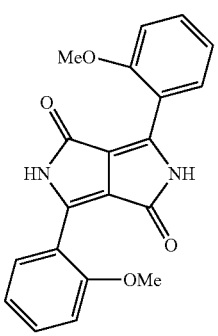

(7)
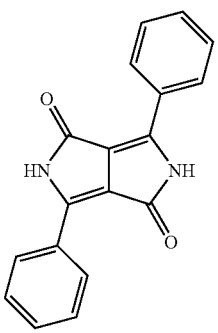

(8)
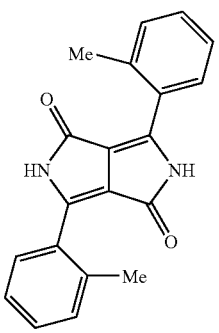

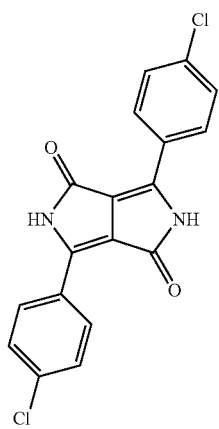
(9)
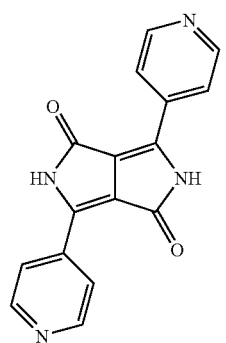
(10)
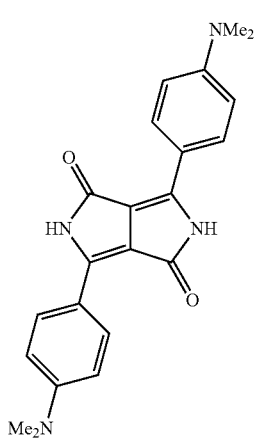
(11)
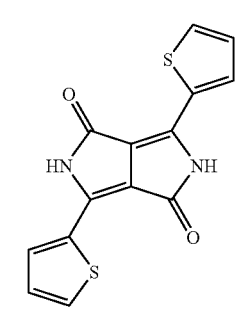
(12)
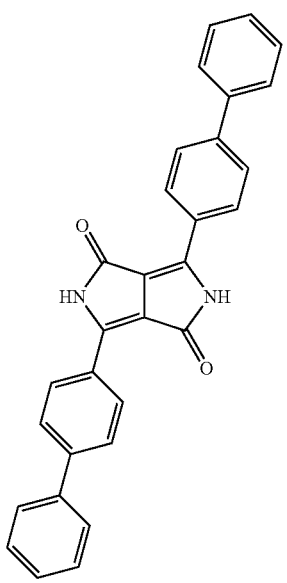
(13)
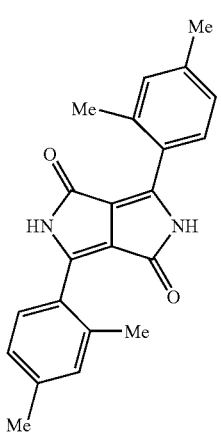
(14)
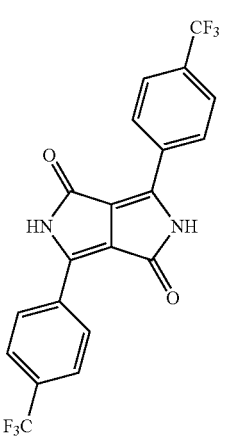
(15)

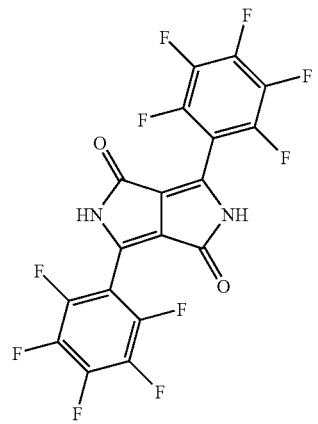
(16)
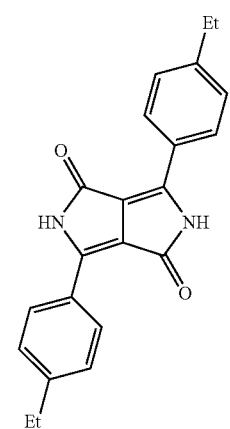
(17)
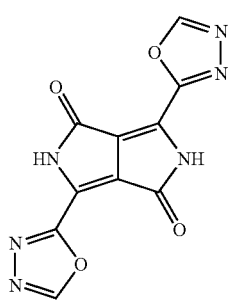
(18)
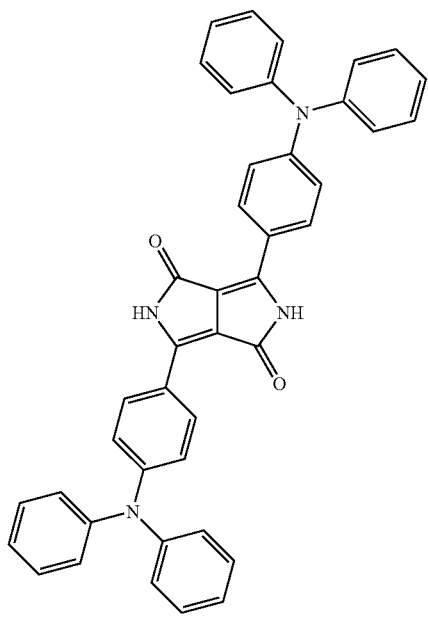
(19)
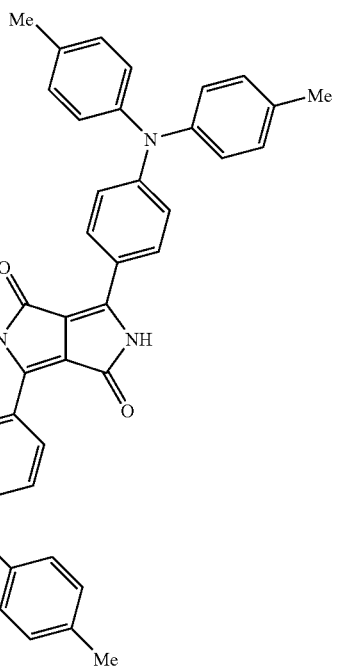
(20)

(21) 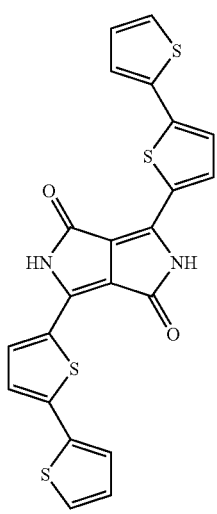
(22) 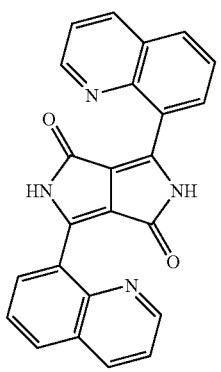
(23) 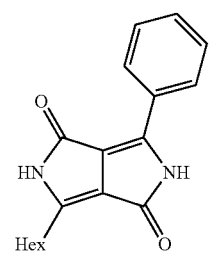
(24) 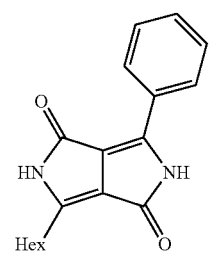
(25) 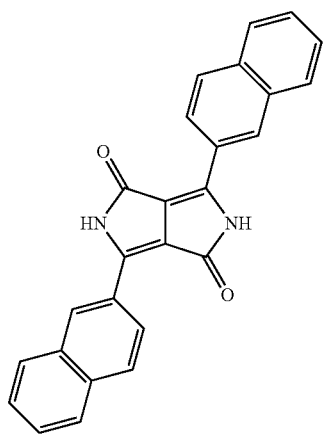
(26) 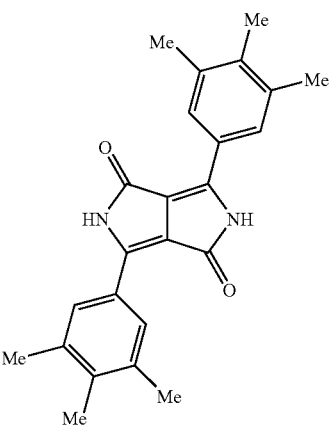
(27) 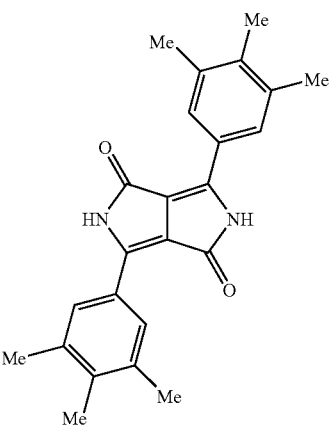

(28)
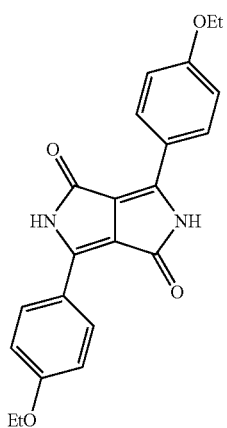
(29)
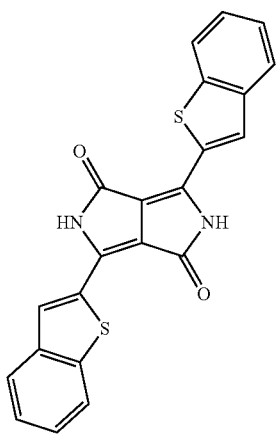
(30)
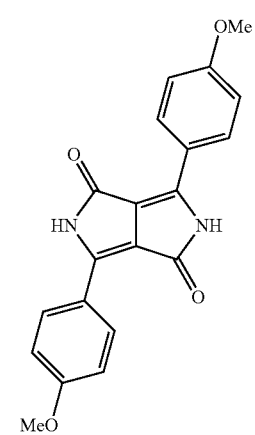
(31)
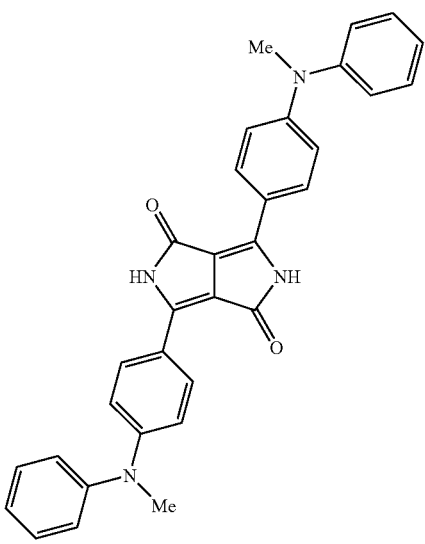
(32)
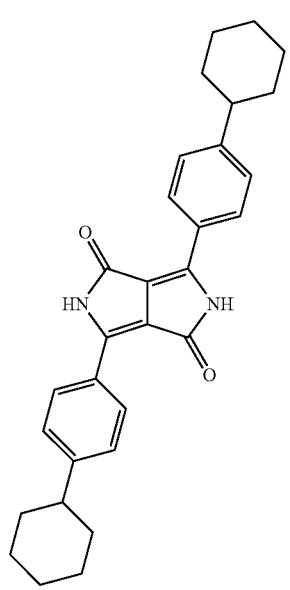
(33)
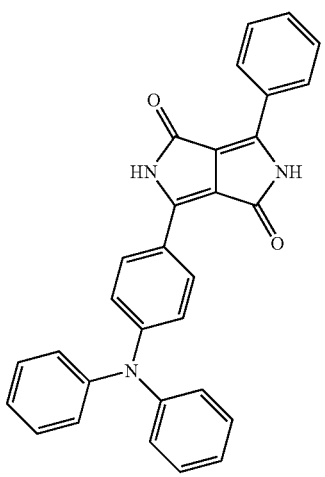

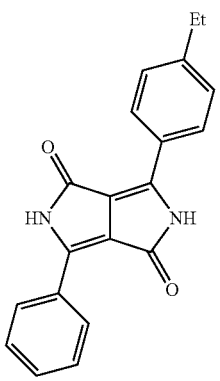 (34)
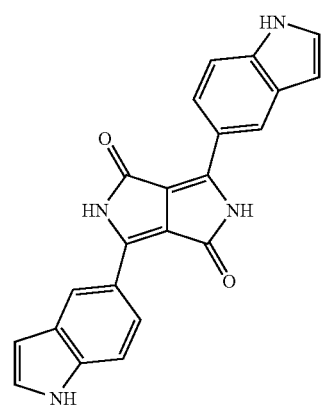 (35)
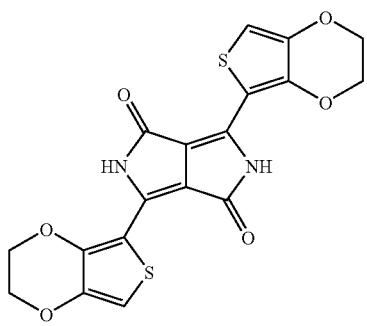 (36)
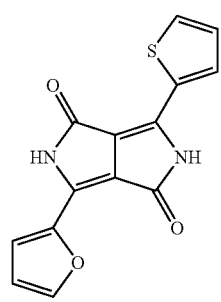 (37)
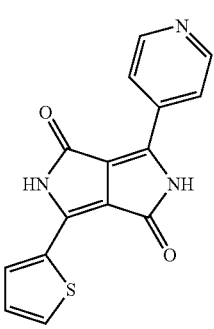 (38)
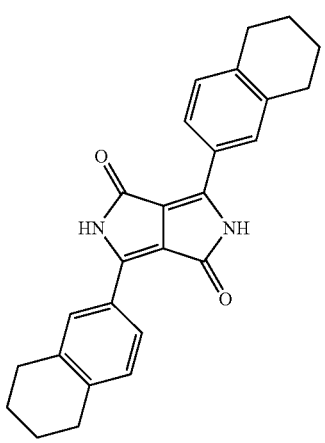 (39)
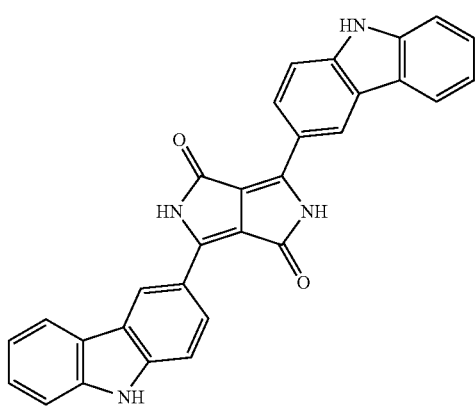 (40)
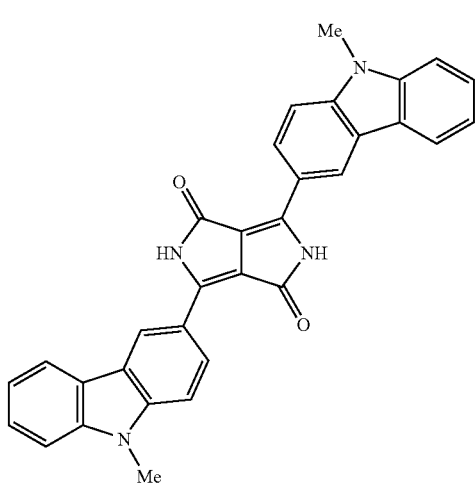 (41)

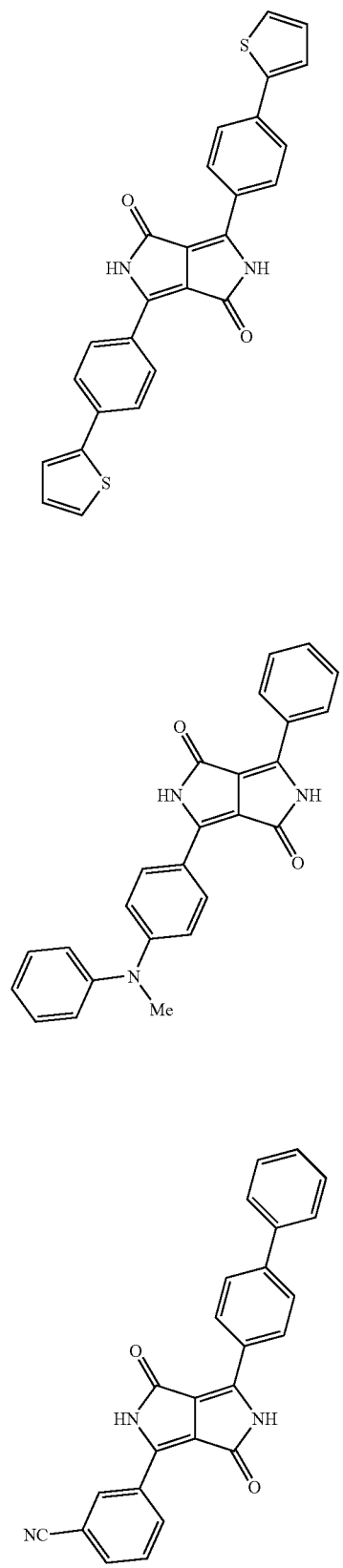
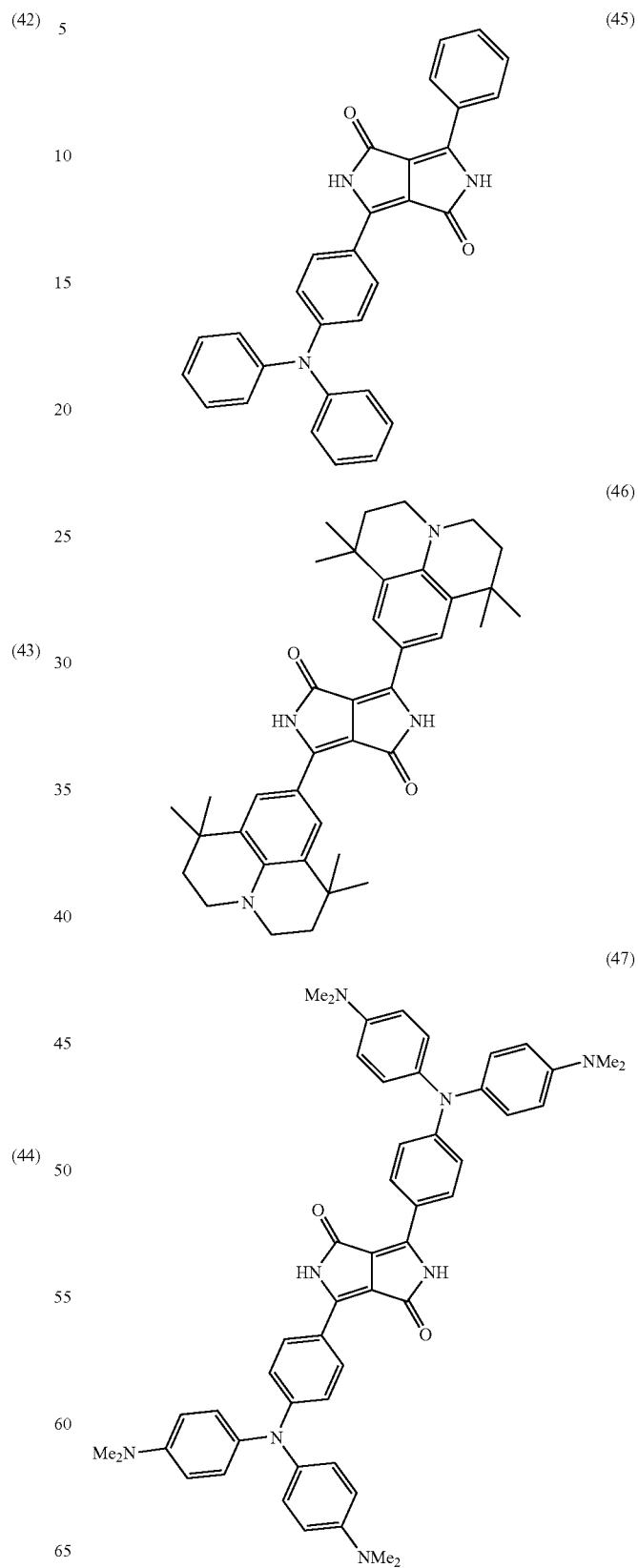

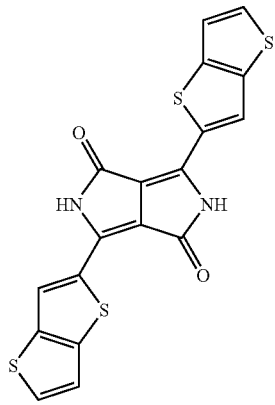
(48)
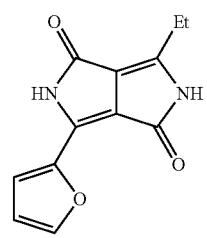
(49)
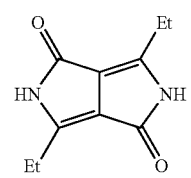
(50)
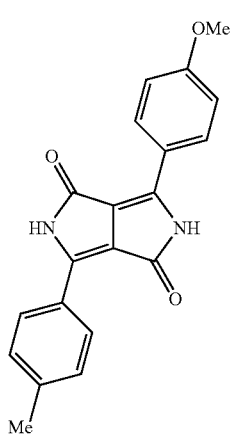
(51)
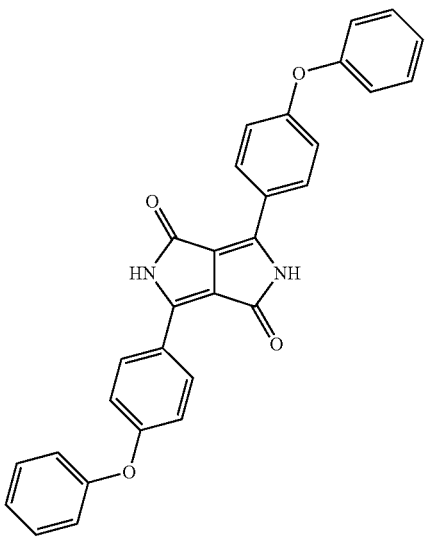
(52)
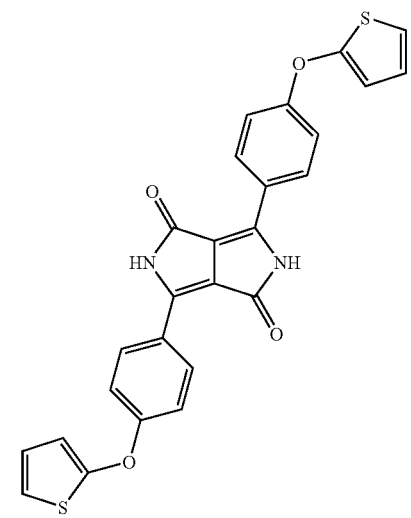
(53)
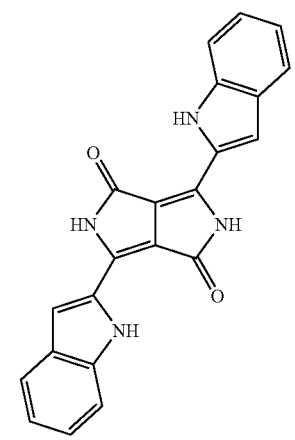
(54)

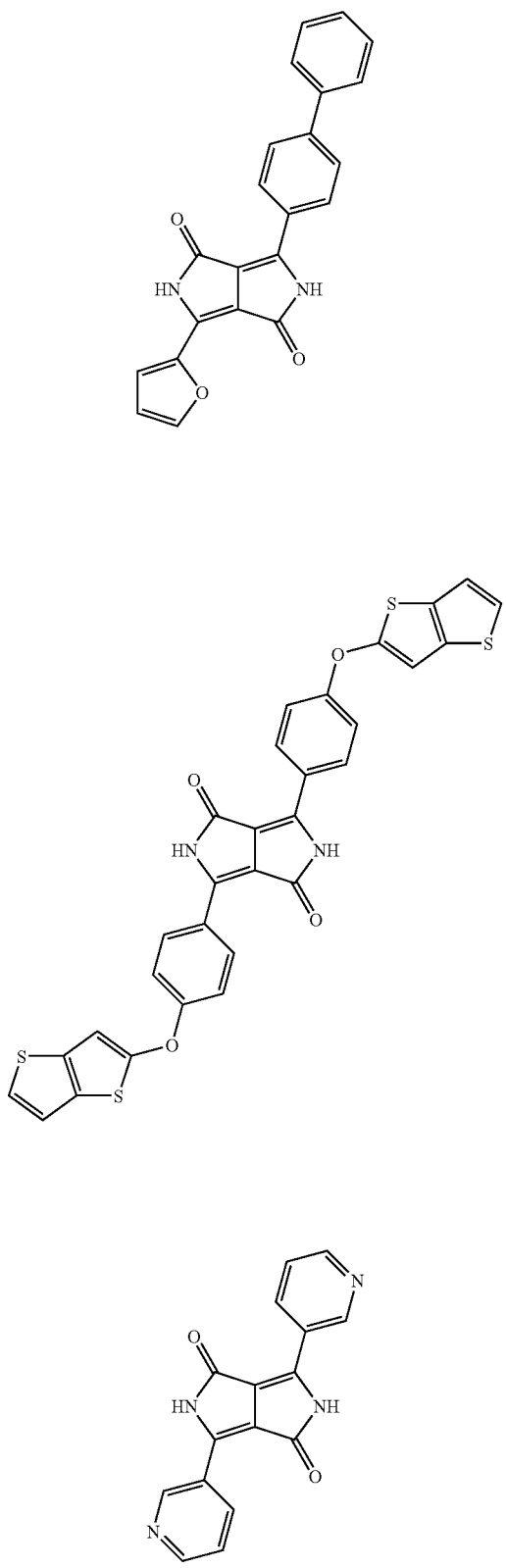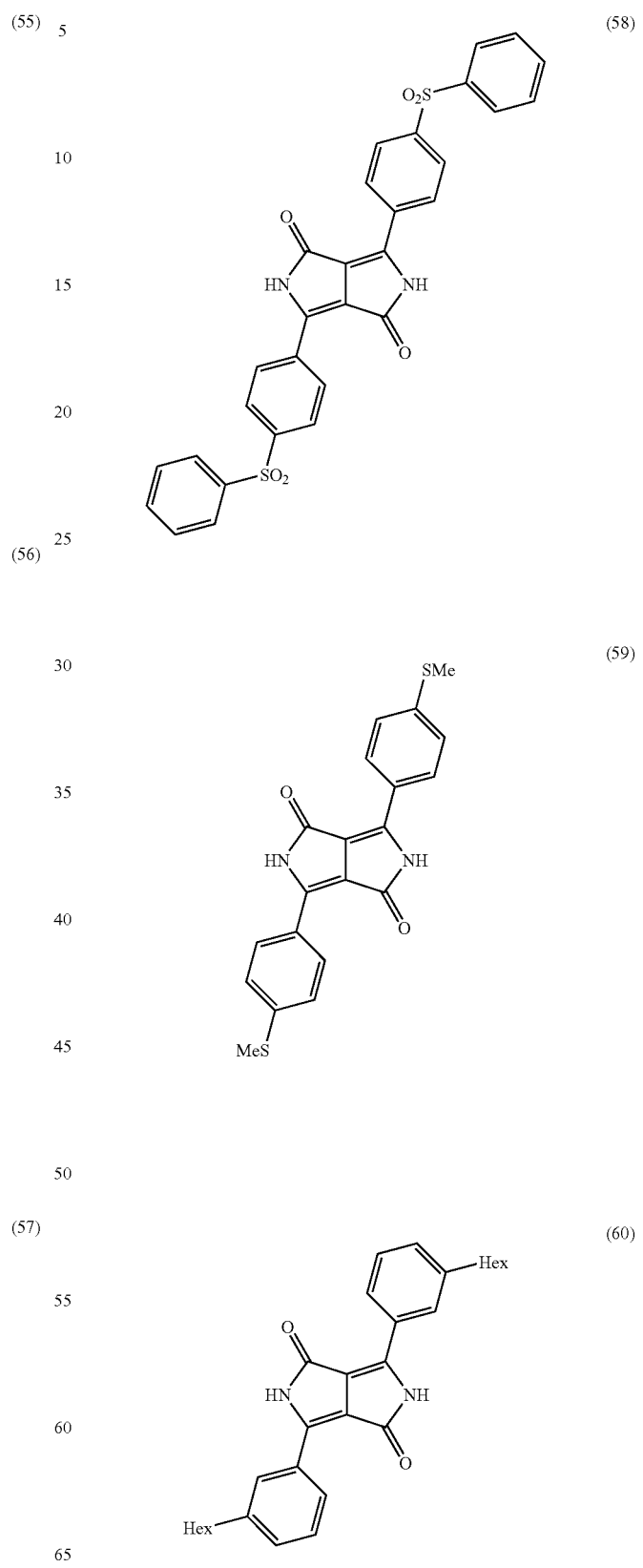

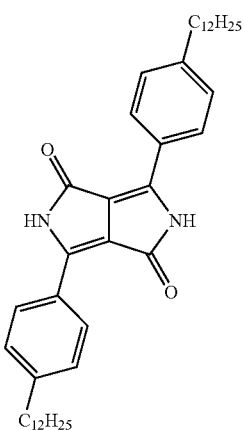
(61)
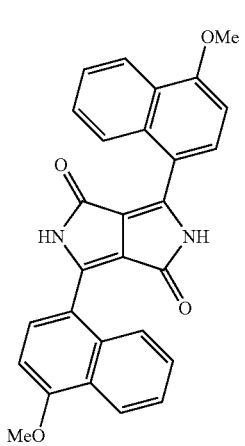
(62)
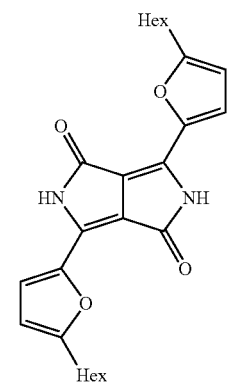
(63)
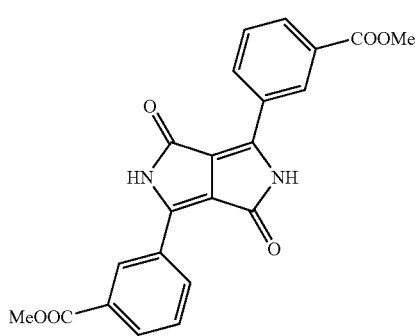
(64)
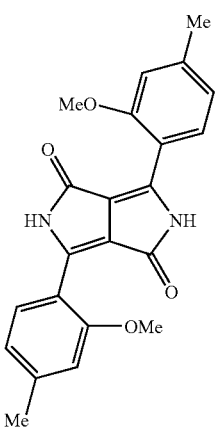
(65)
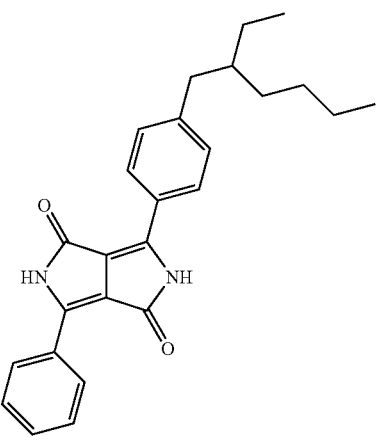
(66)
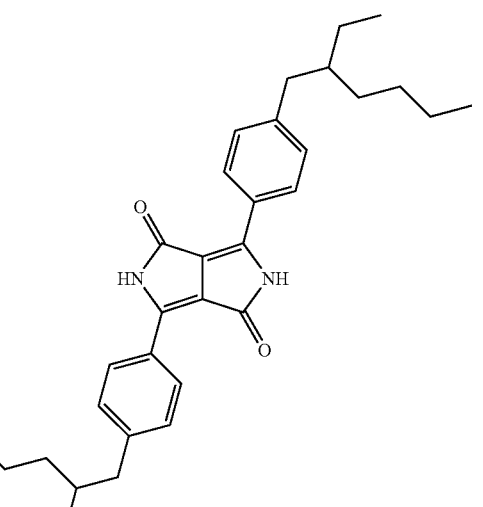
(67)

(68)
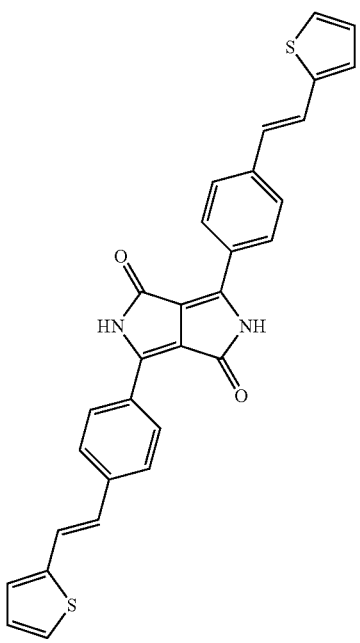

(69)
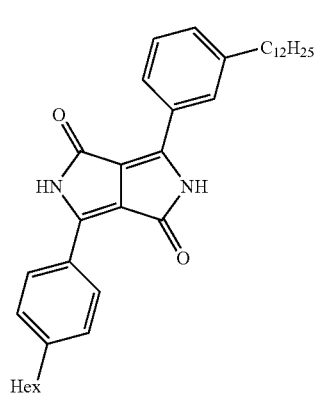

(70)
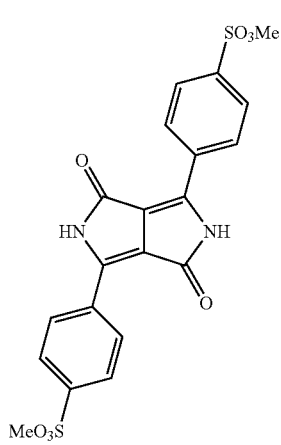

(71)
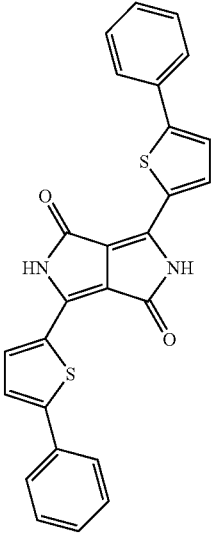

The invention is also characterized in that an organic semiconductor layer which is one of the constituents of a transistor contains a compound represented by the following general formula [3]:

[Chemical formula 7]

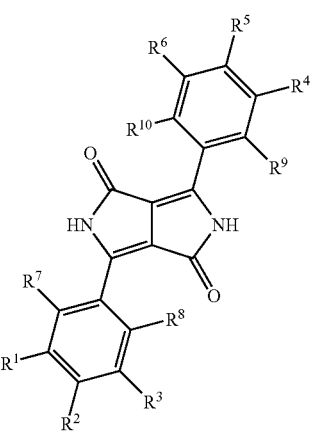

wherein $R^1$ to $R^{10}$ are independently a hydrogen atom, a halogen atom, an alkyl group which has 4 or less carbon atoms and may be substituted with a halogen atom, an alkoxyl group which has 4 or less carbon atoms and may be substituted with a halogen atom, an amino group which has 4 or less carbon atoms and may be substituted with a halogen atom, a nitro group, or a cyano group, and the compound contains at least one halogen atom.

$R^1$ to $R^{10}$ in the compound represented by the general formula [3] in the invention are independently a hydrogen atom, a halogen atom, an alkyl group which has 4 or less carbon atoms and may be substituted with a halogen atom, an alkoxyl group which has 4 or less carbon atoms and may be substituted with a halogen atom, an amino group which has 4 or less carbon atoms and may be substituted with a halogen atom, a nitro group, or a cyano group, and the compound contains at least one halogen atom.

Specific examples of the halogen atom in the invention include fluorine, chlorine, bromine, and iodine.

Examples of the alkyl group, which has 4 or less carbon atoms and may be substituted with a halogen atom, in the invention include methyl, ethyl, propyl, isopropyl, butyl, sec-butyl, tert-butyl, fluoromethyl, difluoromethyl, trifluoromethyl, chloromethyl, trichloromethyl, dichloromethyl, bromomethyl, dibromomethyl, iodomethyl, pentafluoroethyl, 2,2,2-trifluoroethyl, 2-fluoroethyl, 2-iodoethyl, perfluoropropyl, perfluoroisopropyl, 2,2,2-trifluoro-(1-trifluoromethyl)ethyl, 2-bromopropyl, 3-iodopropyl, perfluorobutyl, perfluoro-tert-butyl, 2,2,3,3,4,4,4-heptafluorobutyl, 2-iodo-1 methylpropyl, 4-chlorobutyl, 2-chloro-3-fluoropropyl, and 1,2-dichloro-3-iodobutyl groups.

Examples of the alkoxyl group which has 4 or less carbon atoms and may be substituted with a halogen atom in the invention include methoxy, ethoxy, propoxy, isopropoxy, n-butoxy, tert-butoxy, fluoromethoxy, difluoromethoxy, trifluoromethoxy, chloromethoxy, trichloromethoxy, dichloromethoxy, bromomethoxy, dibromomethoxy, iodomethoxy, pentafluoroethoxy, 2,2,2-trifluoroethoxy, 2-fluoroethoxy, 2-iodoethoxy, perfluoropropoxy, perfluoroisopropoxy, 2,2,2-trifluoro-(1-trifluoromethyl)ethoxy, 2-bromopropoxy, 3-iodopropoxy, perfluorobutoxy, perfluoro-tert-butoxy, 2,2,3,3,4,4,4-heptafluorobutoxy, 2-iodo-1 methylpropoxy, and 4-chlorobutoxy groups.

Examples of the amino group which has 4 or less carbon atoms and may be substituted with a halogen atom include amino, monomethylamino, dimethylamino, N-methyl-N-ethylamino, diethylamino, N-methyl-N-propylamino, monotrifluoromethylamino, ditrifluoromethylamino, dichloromethylamino, N,N-bis(trifluoromethyl)amino, N,N-bis(pentafluoroethyl)amino, chloromethylamino, N-trifluoromethyl-N-propylamino, and N,N-di(chloroethyl)amino groups.

Typical examples of the compound of the general formula [3] in the invention are specifically illustrated below as exemplified compounds (100) to (256). However, the compound is not limited thereto. In the exemplified compounds, Me, Et, Pr and tert-Bu represent a methyl group, an ethyl group, a n-propyl group, and a tert-butyl group, respectively.

[Chemical formula 8]

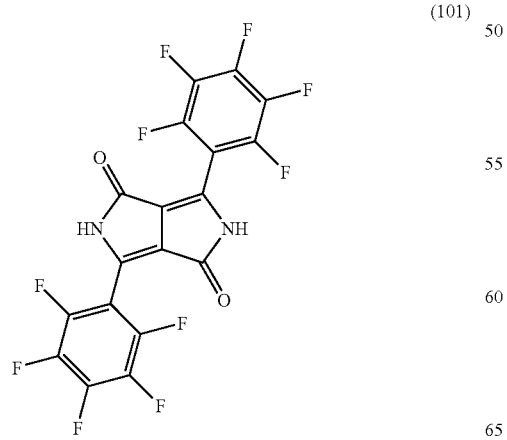

(101)

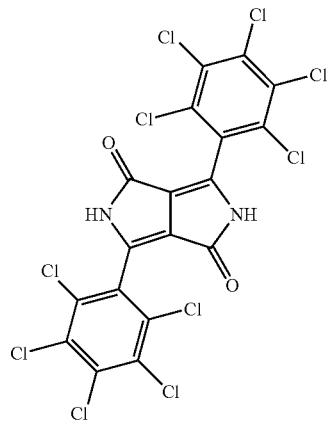

(102)

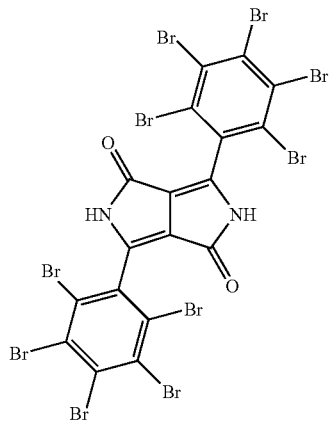

(103)

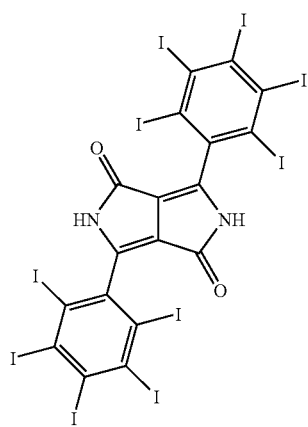

(104)

US 7,977,670 B2
(105) 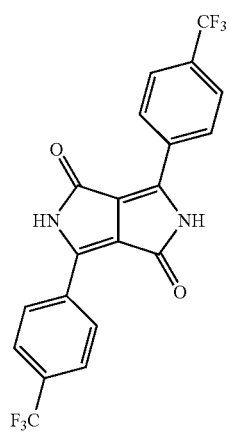
(106) 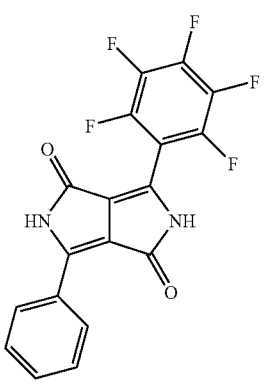
(107) 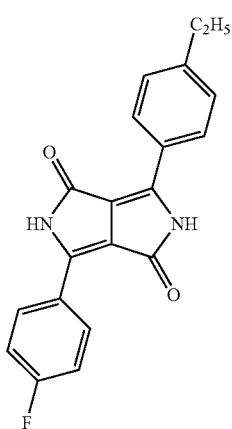
(108) 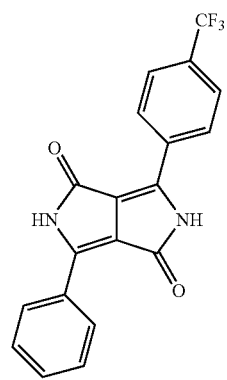
(109)
(110)
(111)
(112)

(113)
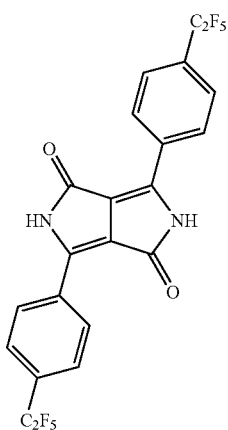
(114)
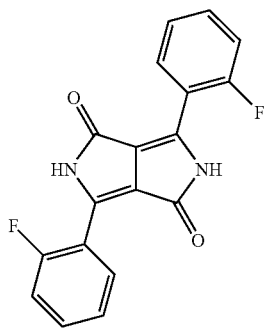
(115)
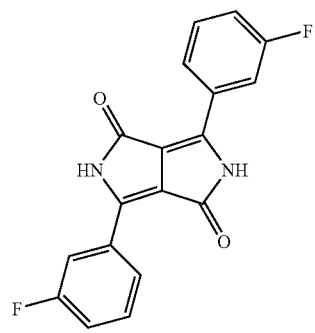
(116)
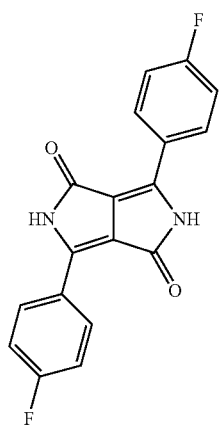
(117)
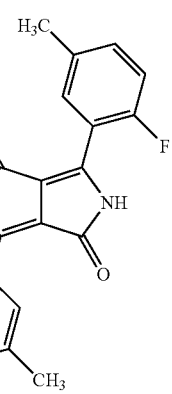
(118)
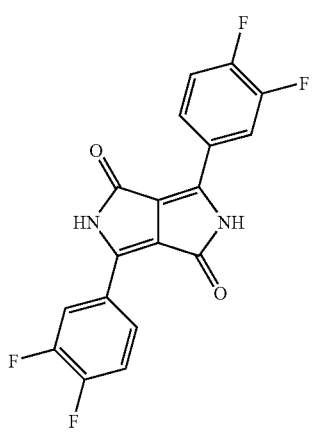
(119)
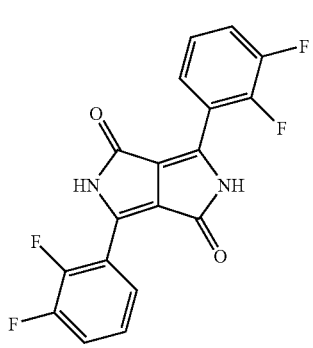
(120)
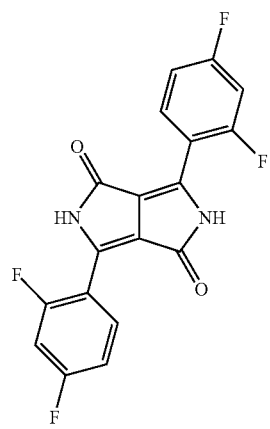

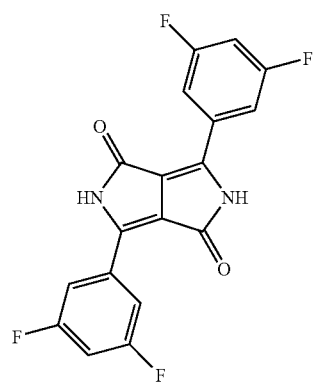
(121)
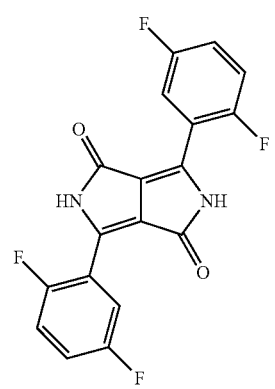
(122)
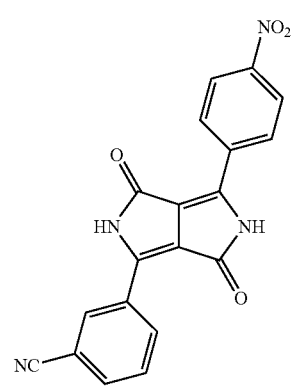
(123)
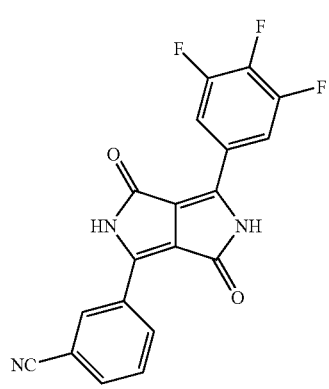
(124)
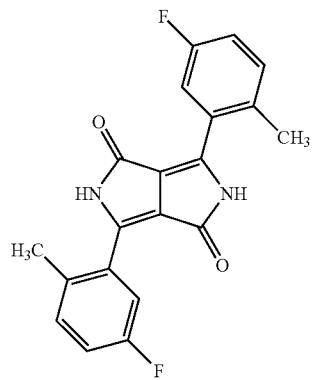
(125)
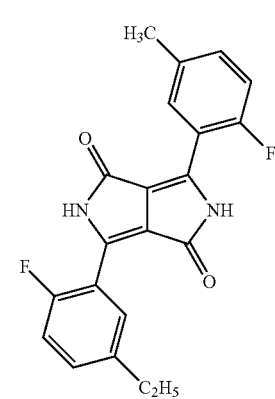
(126)
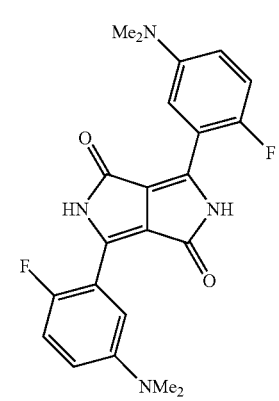
(127)
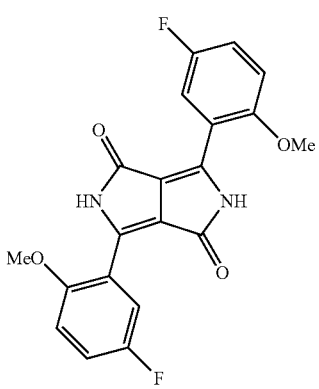
(128)

(129) 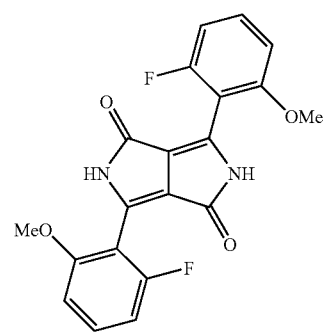
(130) 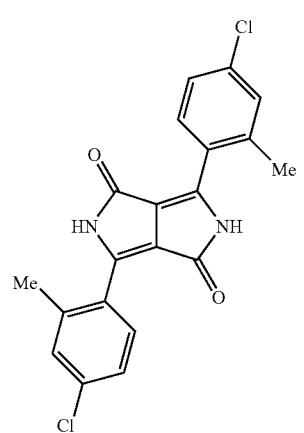
(131) 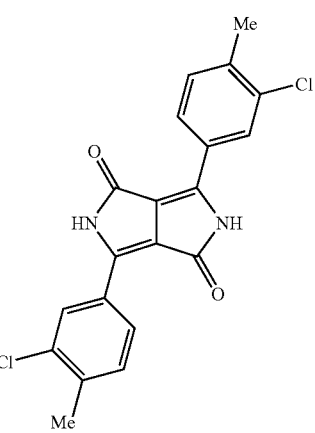
(132) 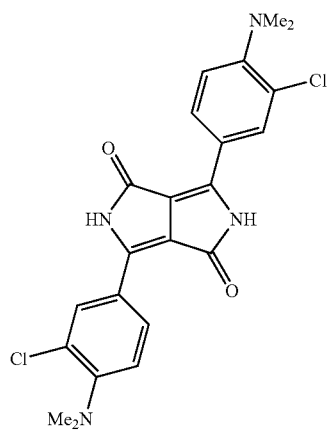
(133)
(134)
(135)
(136)

-continued
(137) 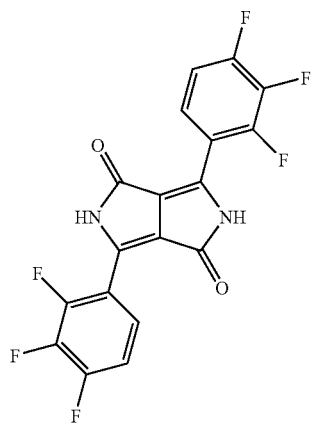
(138) 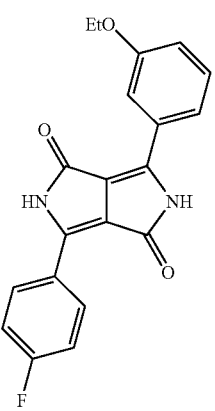
(139) 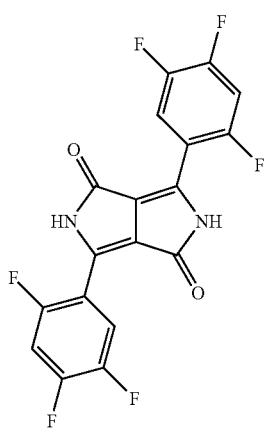
(140) 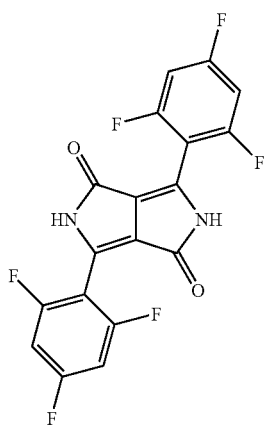
-continued
(141) 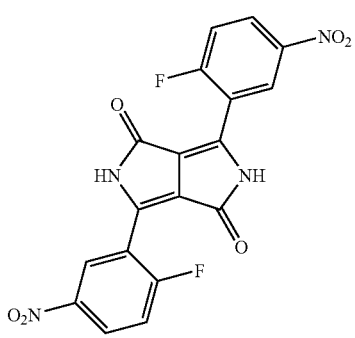
(142) 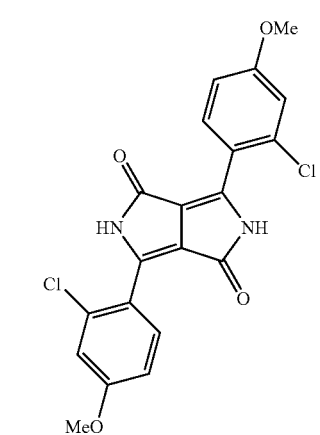
(143) 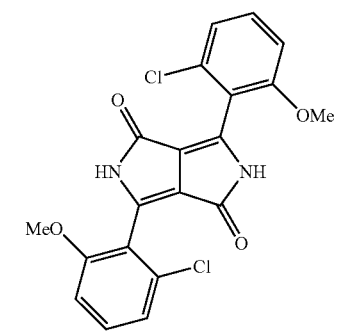
(144) 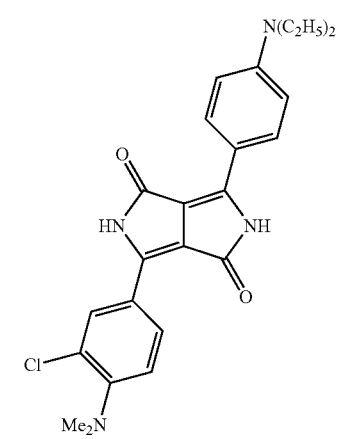

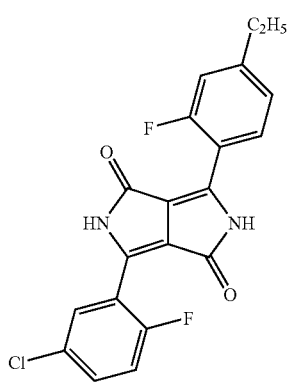
(145)
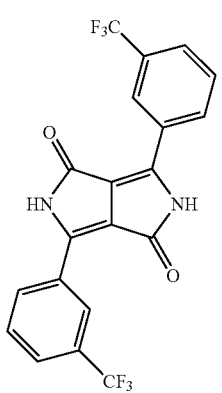
(146)
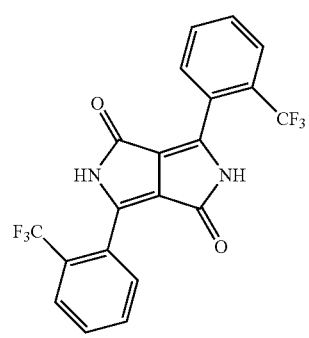
(147)
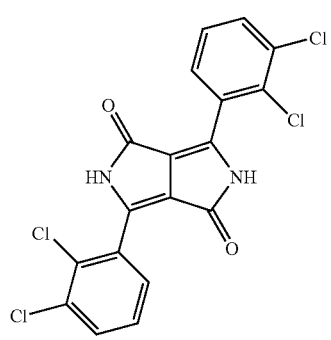
(148)
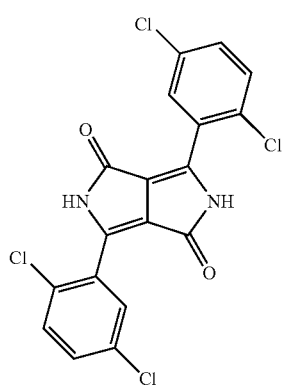
(149)
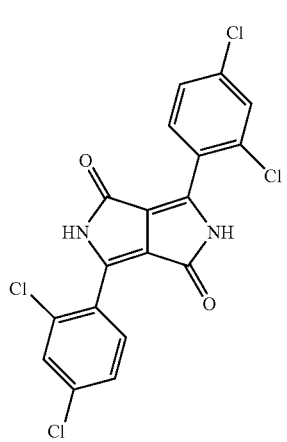
(150)
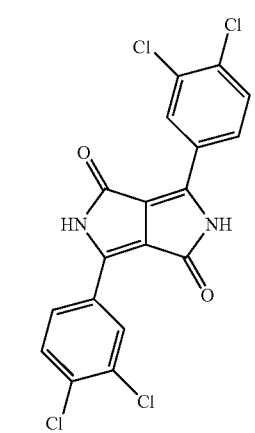
(151)
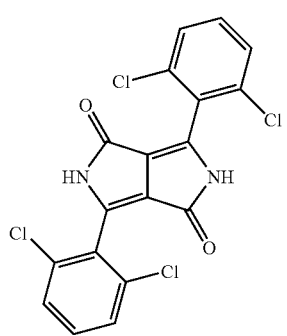
(152)

(153) 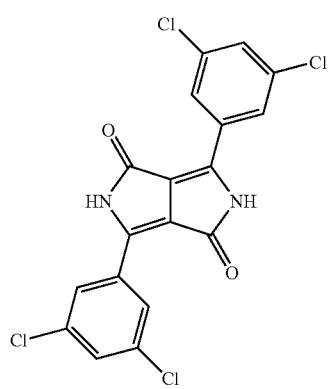
(154) 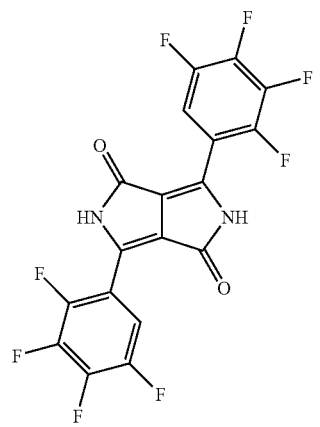
(155) 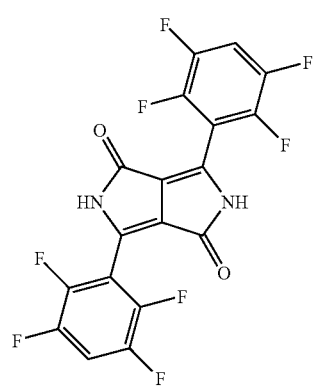
(156) 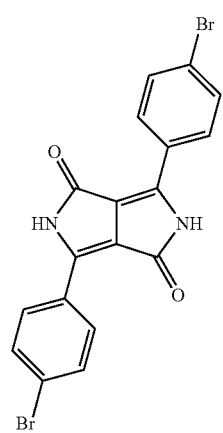
(157) 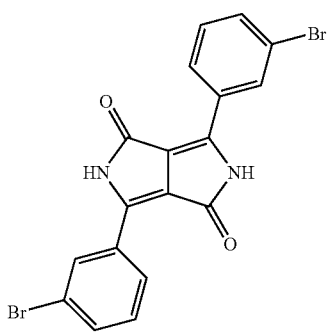
(158) 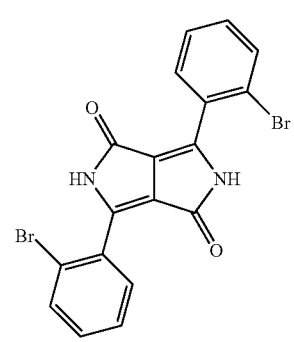
(159) 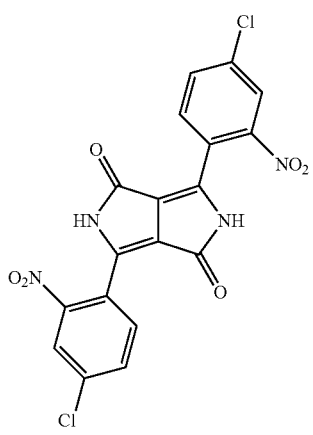
(160) 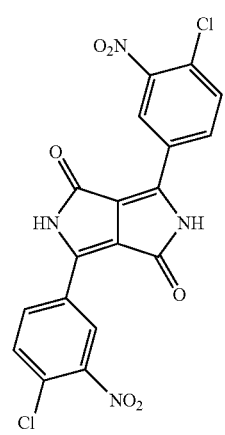

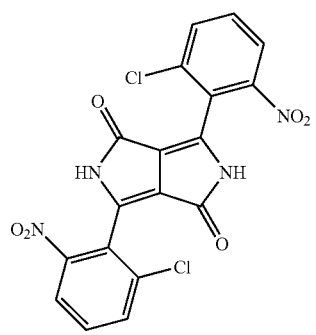
(161)
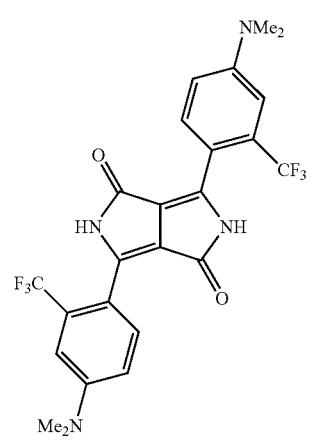
(162)
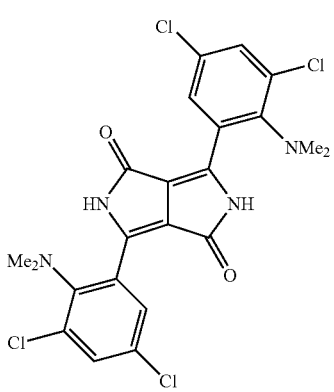
(163)
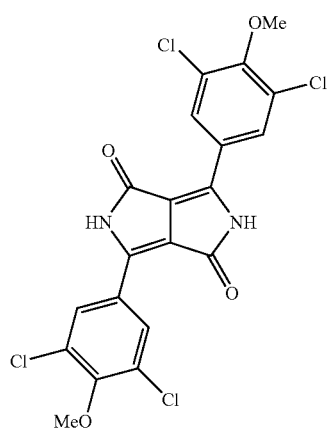
(164)
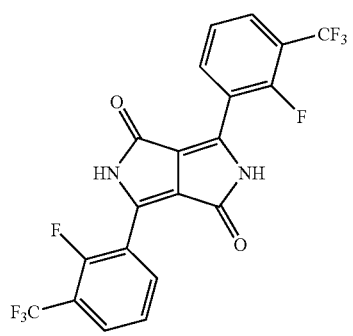
(165)
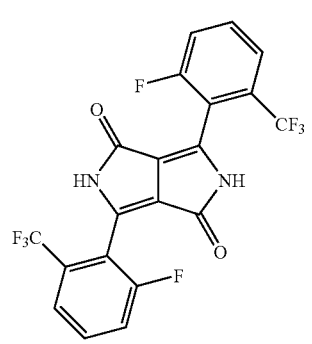
(166)
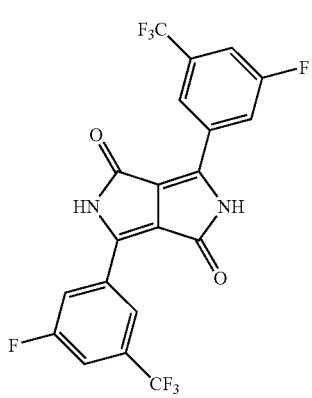
(167)
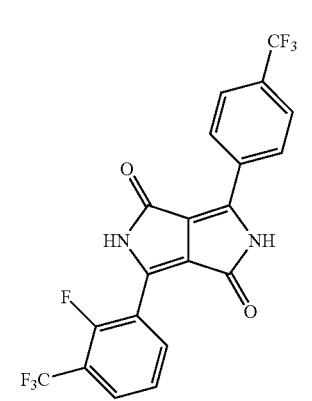
(168)

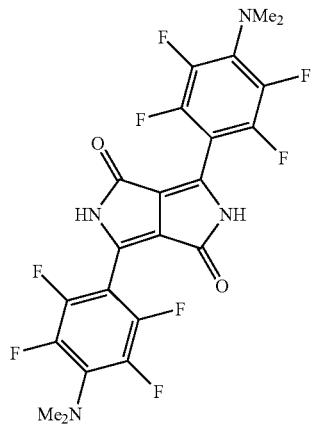 (169)
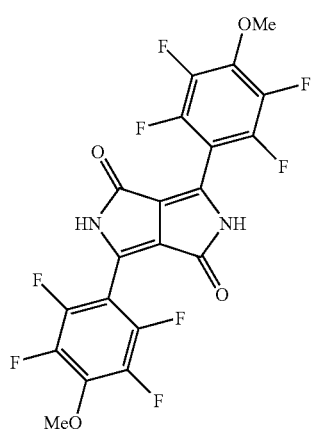 (170)
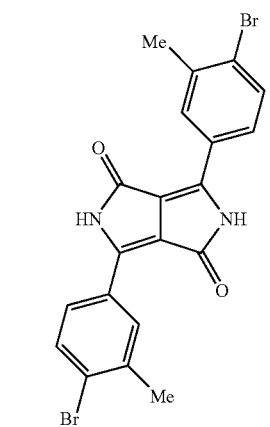 (171)
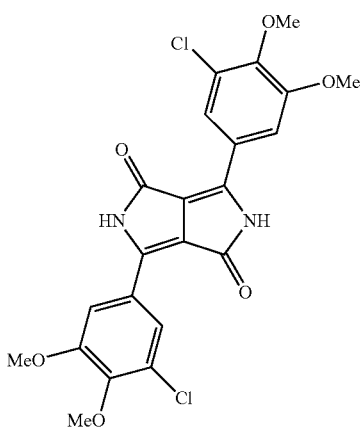 (172)
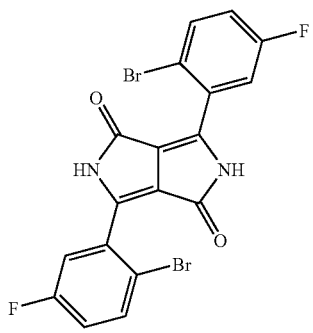 (173)
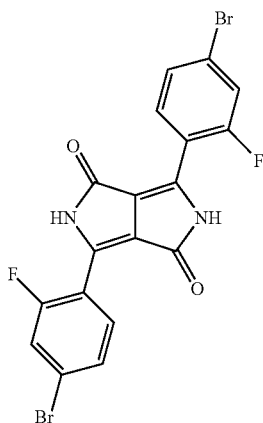 (174)
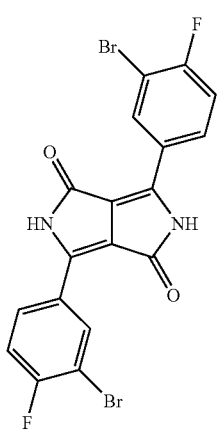 (175)

(176) 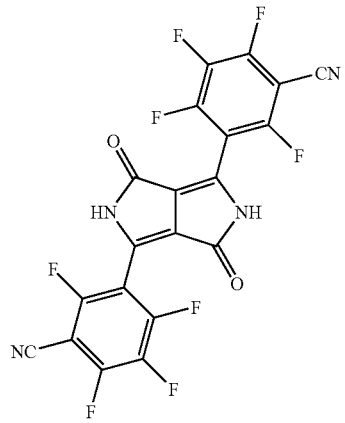
(177) 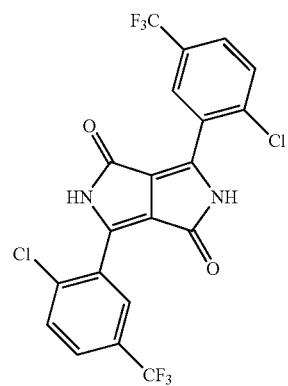
(178) 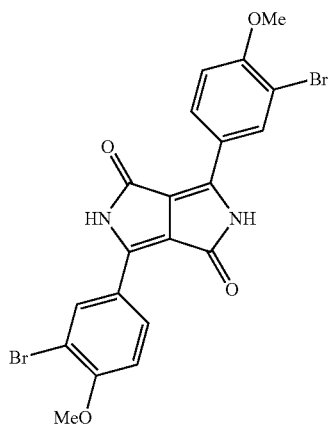
(179) 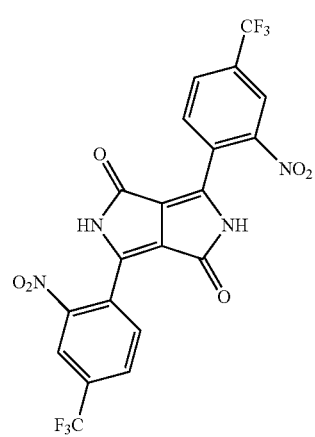
(180) 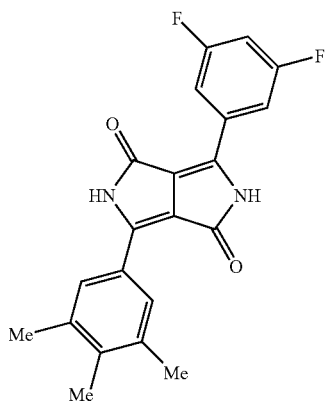
(181) 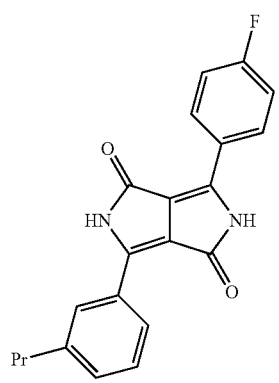
(182) 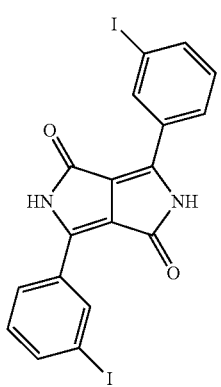
(183) 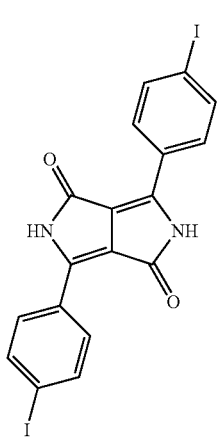

51
-continued
(184)
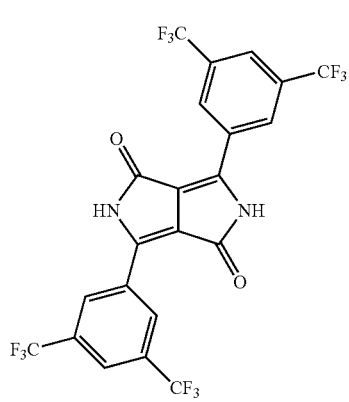
(185)
(186)
(187)
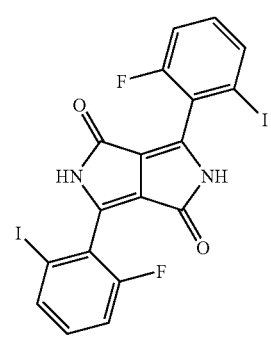
52
-continued
(188)
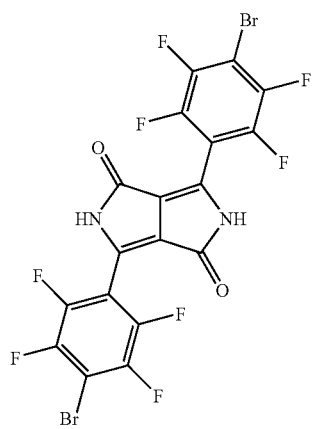
(189)
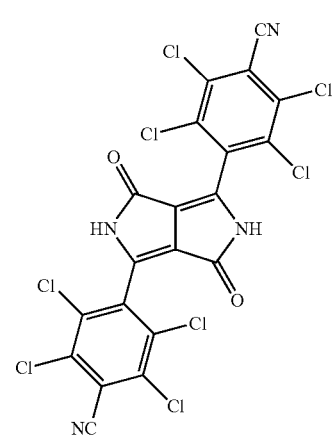
(190)
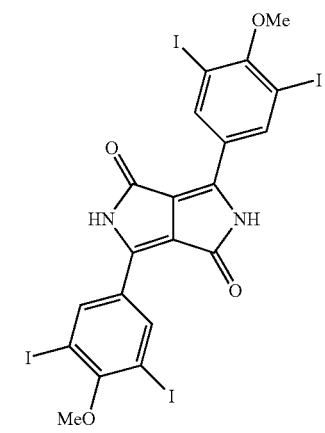

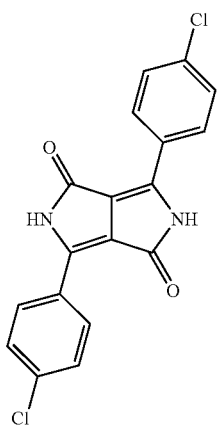
(191)
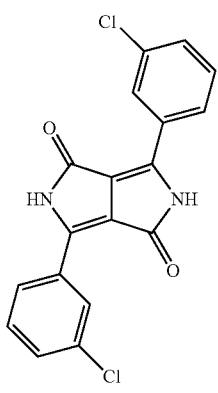
(192)
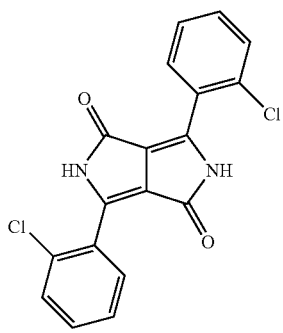
(193)
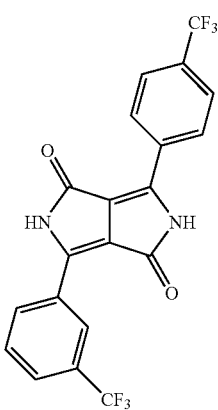
(194)
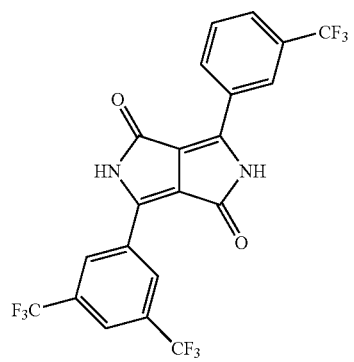
(195)
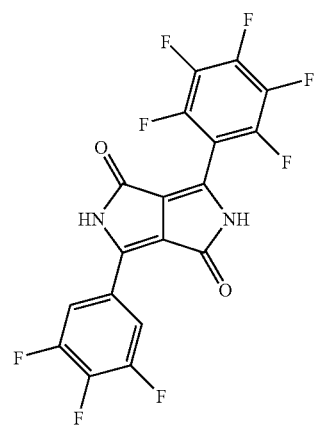
(196)
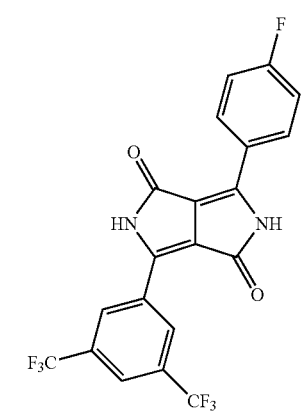
(197)
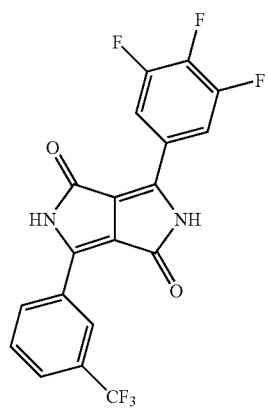
(198)

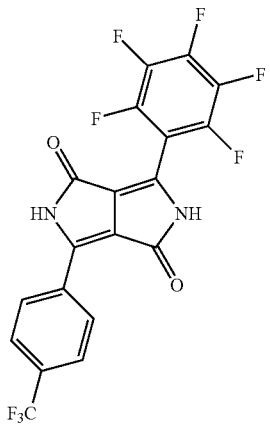
(199)
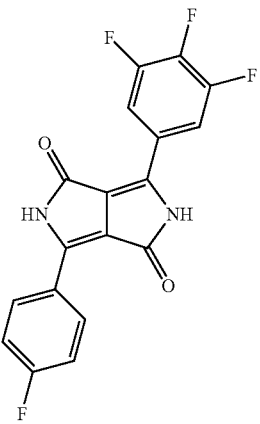
(203)
(200)
(204)
(201)
(205)
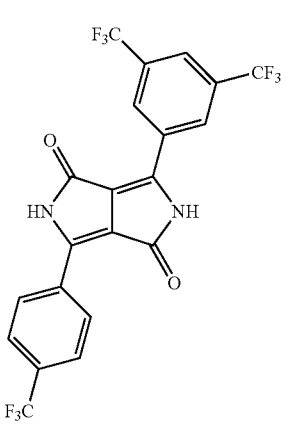
(202)
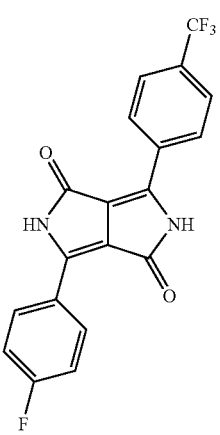
(206)
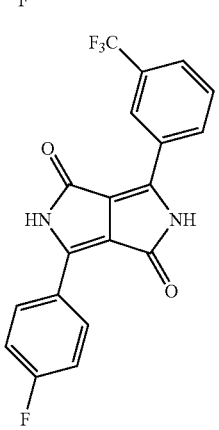

(207) 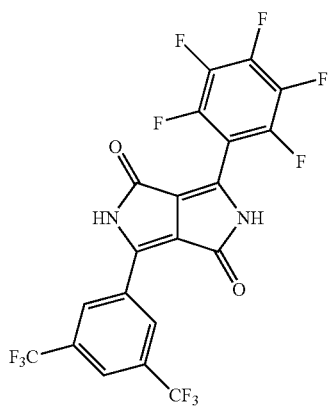
(208) 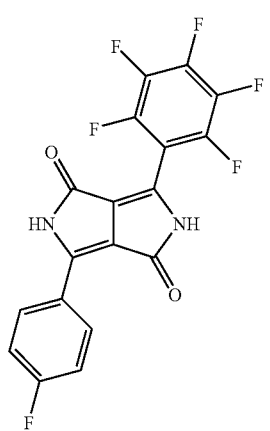
(209) 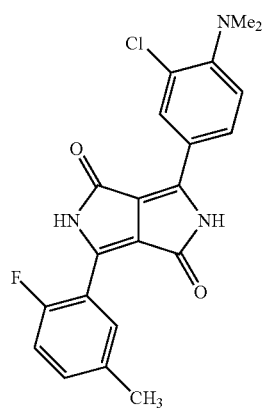
(210) 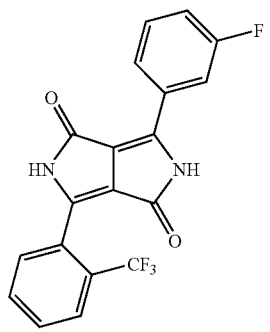
(211) 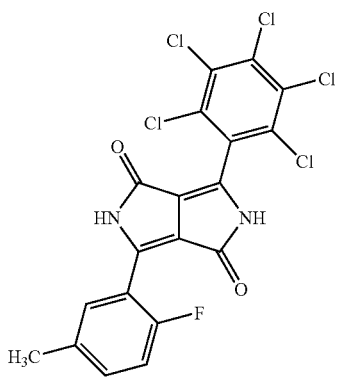
(212) 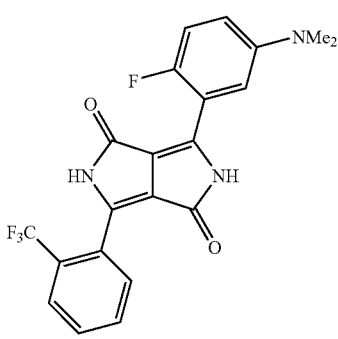
(213) 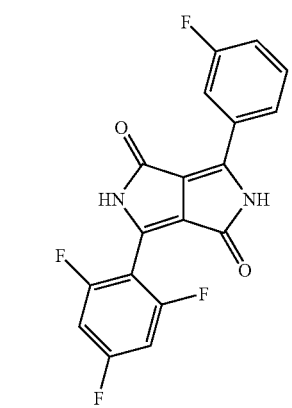
(214) 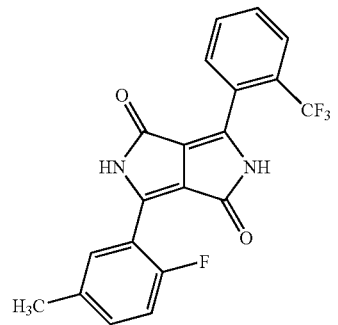

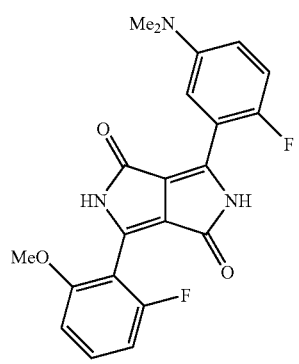
(215)
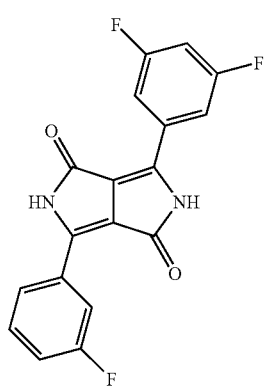
(216)
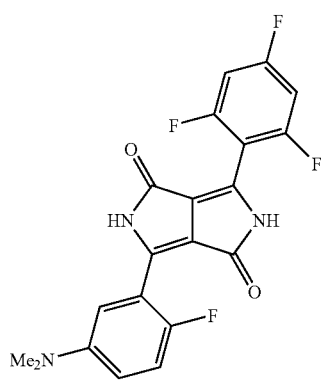
(217)
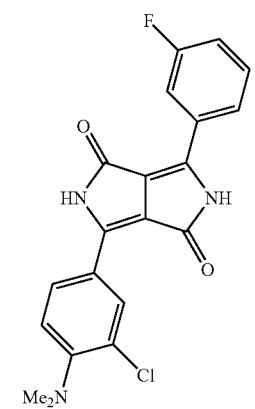
(218)
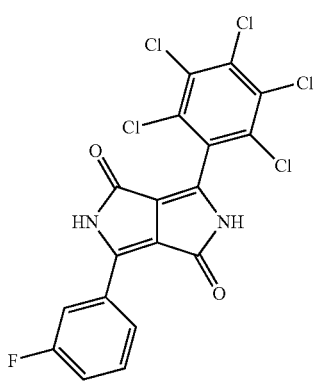
(219)
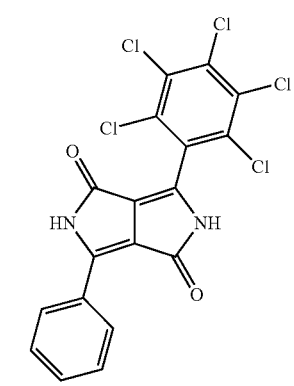
(220)
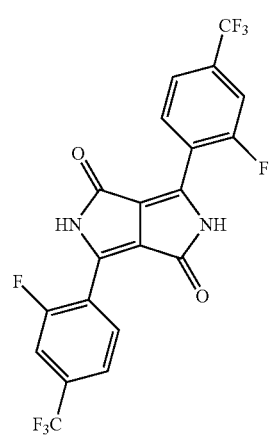
(221)
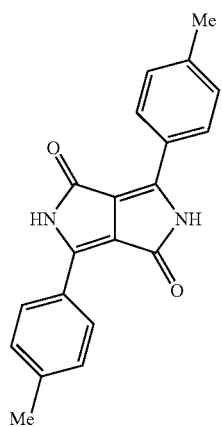
(222)

(223) 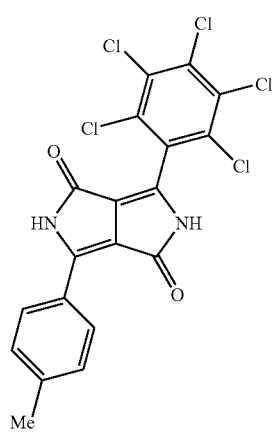
(224) 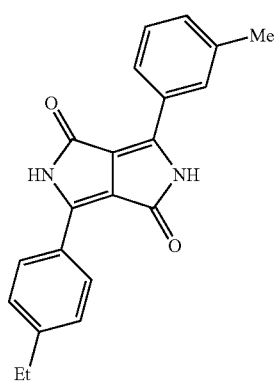
(225) 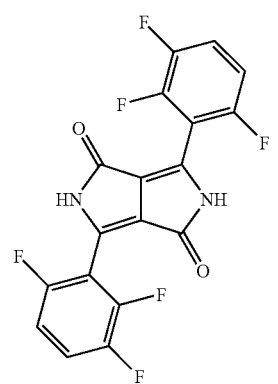
(226) 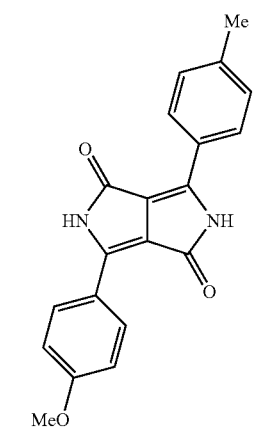
(227) 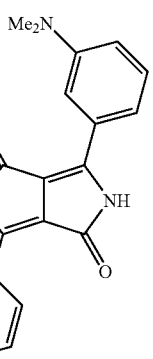
(228) 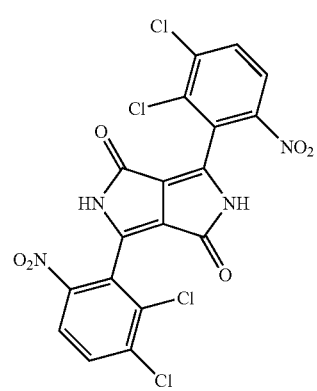
(229) 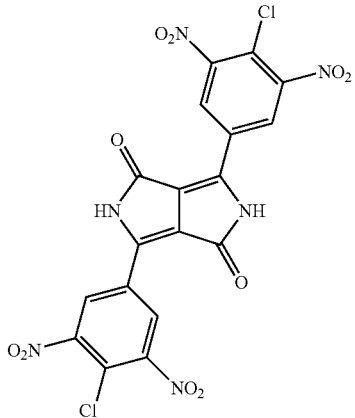
(230) 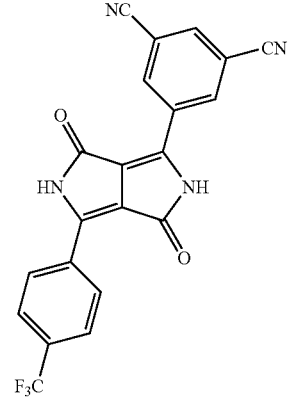

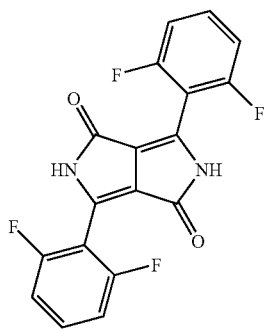 (231)
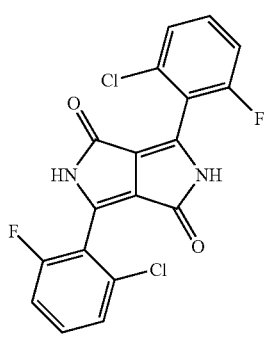 (232)
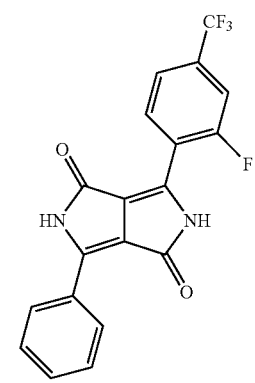 (233)
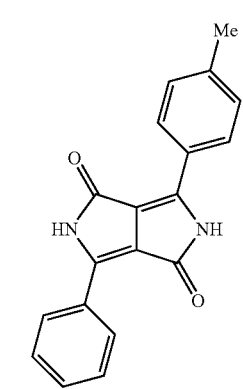 (234)
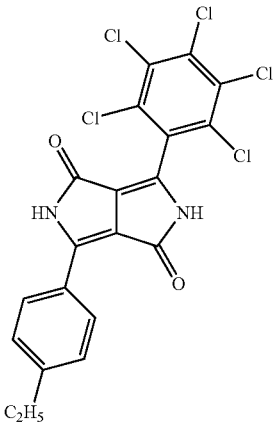 (235)
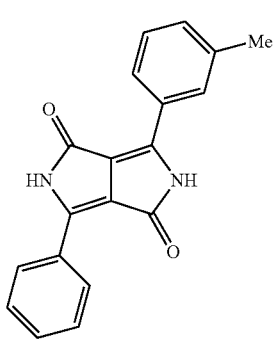 (236)
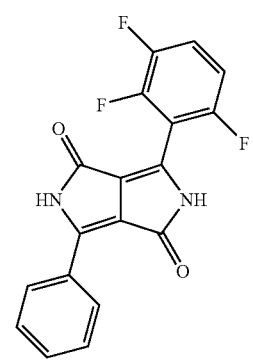 (237)
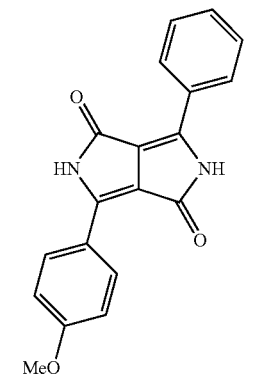 (238)

-continued
(239) 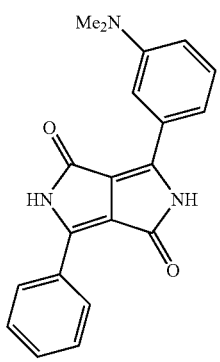
(240) 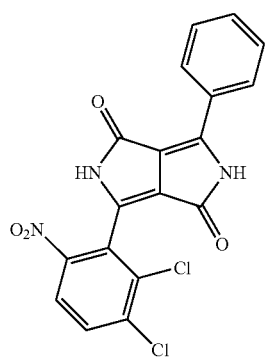
(241) 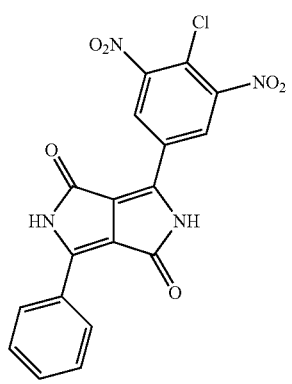
(242) 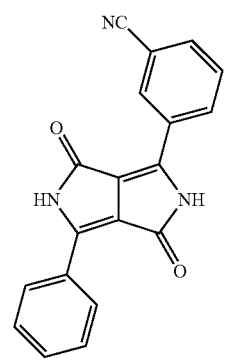
-continued
(243) 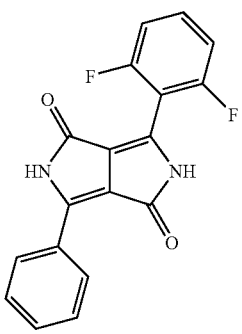
(244) 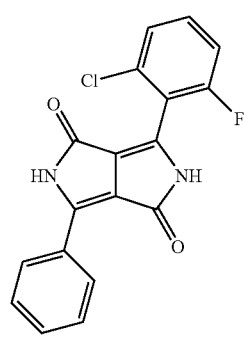
(245) 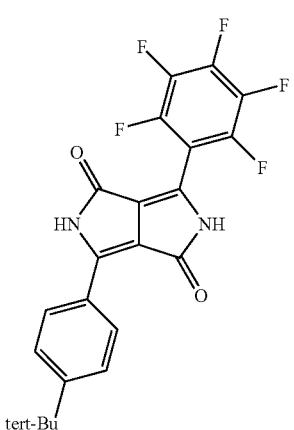
(246) 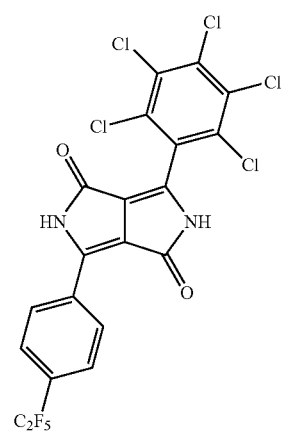

(247) 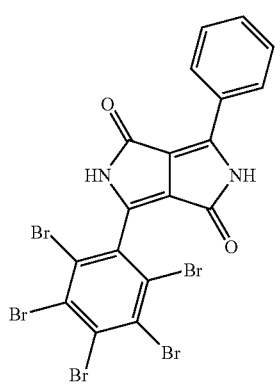
(248) 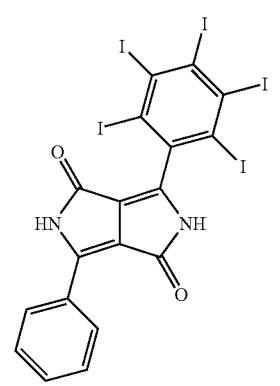
(249) 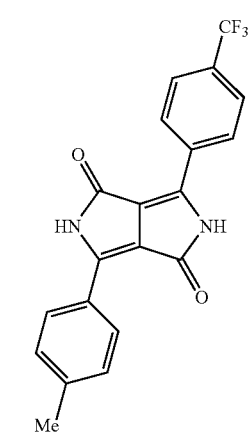
(250) 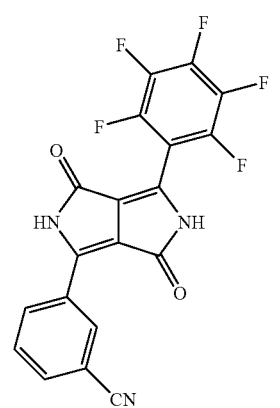
(251) 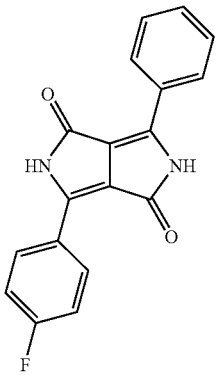
(252) 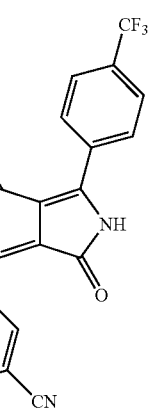
(253) 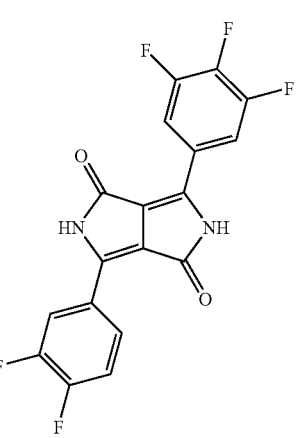
(254) 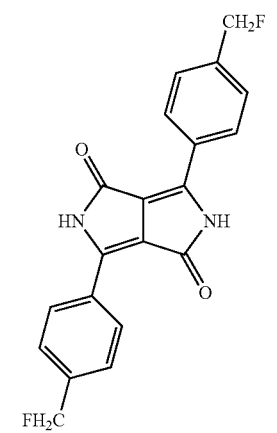

-continued

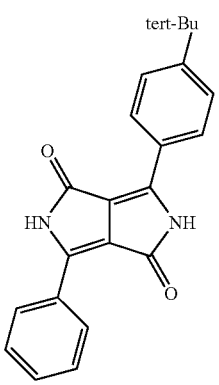
(255)

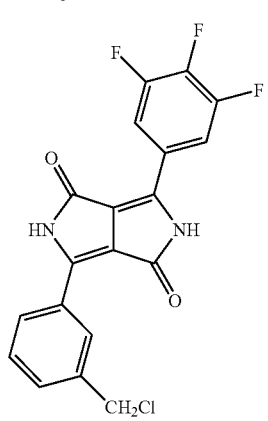
(256)

The use of the compound represented by the general formula [1] or [3] in an active layer (organic semiconductor layer) of an organic transistor device makes it possible to provide a transistor that is less deteriorated by a change thereof with the passage of time. For a specific structure and specification of an organic transistor wherein the active layer can be used, those of any known organic transistor may be used.

Preferred examples of the structure include structures I to X illustrated in FIG. 1.

In FIG. 1, "A" represents a source electrode or a drain electrode (one of the two electrodes is a source electrode and the other is a drain electrode). "B" represents a gate electrode, "C" represents an organic semiconductor layer, "D" represents a gate insulating layer, and "E" represents a substrate. In FIG. 1, II, IV, VI and VIII, a substrate also functions as its gate electrode.

In order to use the compound represented by the general formula [1] or [3] as an active layer of an organic transistor device, vacuum vapor-deposition is preferable to form a film on a substrate. By heating the substrate beforehand in this case, characteristics thereof can also be improved. By using a solution wherein the compound is dissolved in an appropriate organic solvent, a film can be formed on a substrate by means of spin coating, drop casting, ink-jetting, screen printing or the like. Spin coating is preferable to form a film.

When the film is formed by vacuum vapor-deposition, the vapor-deposition rate is preferably 1 nm/sec or less, more preferably 0.5 nm/sec or less, even more preferably 0.1 nm/sec or less.

The state of the organic semiconductor layer formed on the substrate as described above may be evaluated as follows:

Ellipsometry is a method that a change in the polarization state thereof is observed when light is reflected or transmitted in a substance, and optical constants (the refractive index and the extinction coefficient) is determined. By processing the obtained data, the film thickness and the refractive index of the thin film can be calculated.

In the invention, it is supposed that about any organic semiconductor thin film represented by the general formula [3], incident light is divided into a polarized light parallel to the surface onto which the incident light is radiated, and a polarized light perpendicular to the surface. After incident light transmitted an organic semiconductor thin film, a device for measuring a change in the polarization state (ellipsometer) was used to measure the retardation of each of the polarized lights. The measuring wavelength at this time was set to 650 nm, which is not absorbed by the compound, and the incident angle of the incident light was set to 45 degrees.

The phenomenon has not been analyzed yet in detail; however, in the invention, it has been understood that the relationship between the retardations of the polarized lights and the vapor-deposition rate is that: as the vapor-deposition rate is smaller, the absolute values of the retardations become larger and further the stability of the transistor increases.

At present, it is assumed that this is probably related to the arrangement or orientation of molecules in the thin film. Experimental results demonstrate that when the absolute values of the retardations of the polarized lights at 650 nm are 1 degree or more, preferably 3 degrees or more, transistors excellent in stability over time are obtained, and when the values are up to about 1 degrees, transistors have excellent stability over time. However, it is considered that when the values are more than 10 degrees (for example, about 15 degrees), transistor keeps the excellent stability over time.

As the substrate, a glass substrate or a silicon substrate may be used. From the viewpoint of lightness and flexibility, a plastic film may be used, for example, polyethylene, polyethylene terephthalate, polyethylene naphthalate, polyethersulfone, polypropylene, polyimide, polycarbonate, and cellulose triacetate. Depending on the structure of the device, the substrate itself may also function as an electrode. In this case, the characteristics can be improved by heating the substrate.

During the formation of the film, the temperature of the substrate may be room temperature, and ranges preferably from 50 to 250° C., more preferably from 70 to 200° C., even more preferably from 70 to 150° C.

In the invention, the material for the source electrode, the drain electrode and the gate electrode is not particularly limited as long as the material is an electroconductive material. Specifically, gold, platinum, palladium, aluminium, indium, calcium, potassium, magnesium, tin, lead, indium/tin oxide (ITO), silver paste, carbon paste, graphite, glassy carbon, lithium, lithium fluoride/aluminum laminate, calcium/aluminum laminate, silicon, ruthenium, manganese, yttrium and titanium; and alloys thereof. However, the material is not limited to these materials. Typical examples of the alloys include magnesium/silver, magnesium/indium, and lithium/aluminium. However, the alloys are not limited thereto. The ratio in each of the alloys is controlled by the temperature of the vapor-deposition source, the atmosphere, the vacuum pressure, and others, and is selected into an appropriate ratio. The source electrode, the drain electrode, and the gate electrode may each be formed into a structure of two or more layers if necessary. Furthermore, an electroconductive electrode which uses an organic material, for examples, electroconductive polypyrrole, electroconductive polythiophene, electroconductive polyaniline, and PEDOT/PSS, can be used.

As a process for fabricating the electrodes, any process, for examples, dry film-fabricating processes such as vacuum vapor-deposition, sputtering, plasma, and ion plating, and wet film-fabricating processes such as spin coating, dipping, and flow coating may be conducted. The electrodes may each be formed by using a coated film with lithography, laser ablation, or the like.

An electrode surface may be modified with a self-assembled monolayer (SAM) to lower the surface energy of the electrode and improve the crystal growth or the crystal arrangement of the organic semiconductor material, the wettability between the organic semiconductor material and the electrode, and others. In the case of using, for example, a gold electrode, surface-modification with an alkane thiol is preferable.

As the gate insulating layer, various insulating layers may be used. An inorganic oxide having a high dielectric constant is particularly preferred. Examples of the inorganic oxide include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth tantalate niobate, and trioxide yttrium. More preferred are silicon oxide, aluminum oxide, tantalum oxide and titanium oxide. An inorganic nitride such as silicon nitride and aluminum nitride can be preferably used.

The method for forming the gate insulating film may be a dry process such as vacuum vapor-deposition, the molecular beam epitaxial growing method, the ion cluster beam method, the low-energy ion beam method, ion plating, CVD, sputtering, or the atmospheric plasma method, or a wet process such as spray coating, spin coating, blade coating, dip coating, casting, roll coating, bar coating, die coating, any other painting method, or a method based on patterning, such as printing or ink-jetting. In accordance with the raw material, an appropriate method may be used.

The wet process may be a method of painting a liquid wherein fine particles of an organic oxide are dispersed in any organic solvent or water by an optional use of a dispersion aid such as a surfactant, and then drying the painted liquid, or the so-called sol-gel method that a solution of an oxide precursor, such as an alkoxy compound, is painted and dried.

A hydrophilic gate insulating film can be changed from hydrophilicity to hydrophobicity by subjecting the film to a chemical surface treatment that may be of various types. This improves the wettability between the gate insulating film and the hydrophobic organic semiconductor layer and the crystallinity of the semiconductor material. An advantageous effect that a current leakage is decreased is also provided. As a typical surface treatment material, a silane material is preferred, for examples, hexamethyldisilazane (HMDS), octyltrichlorosilane (OTS), 7-octenyltrichlorosilane (VTS), tridecafluoro-1,1,2,2-tetrahydrooctyltrichlorosilane (FTS), and benzyltrichlorosilane (BTS). However, the surface treatment material is not limited thereto.

An organic gate insulating film may be polyethylene, polyvinyl chloride, polyimide, polyamide, polyester, polyvinyl phenol, polyvinyl alcohol, novolak resin, cyanoethylpullulan, polyacrylonitrile, parylene, or the like. Copolymers thereof may be used.

According to the invention, it is possible to provide an organic transistor device having both of an excellent ON/OFF ratio and a high stability over time.

Hereinafter, the invention will be more specifically described by the examples; however, the invention is not limited thereby.

EXAMPLES

Example 1

Compounds represented by the general formula [1] were each used as an organic semiconductor material to produce organic transistor devices 1 to 46 independently by the following two methods:

(1) Dry Process

A thermally oxidized layer was formed as a gate insulating layer on a Si wafer having a resistivity of 0.02 Ωcm as a gate electrode. Thereafter, the resultant was surface-treated with hexamethyldisilazane (HMDS). By vacuum vapor-deposition (vacuum pressure: $2.2 \times 10^{-6}$ Torr, vapor-deposition rate: 0.05 nm/sec), some compounds shown in Table 1 were each stacked thereon into a thickness of 70 mm. Furthermore, a mask was used to vapor-deposit gold onto the surface of this film to form a source electrode and a drain electrode. In this way, an organic transistor device was produced wherein the film thickness of the source electrode and the drain electrode was 300 nm, the channel width (W) was 5 mm, and the channel length (L) was 20 μm.

(2) Wet Process

A substrate treated in the same way as in the case of the vacuum vapor-deposition was used, and a spin coater was used, thereon, a solution of each of some compounds shown in Table 1 in toluene (or DMSO). The resultant was naturally dried in ambient temperature to form a semiconductor layer (thickness: 100 nm), and further the resultant was thermally treated at 80° C. for 30 minutes under nitrogen atmosphere. Furthermore, a mask was used to vapor-deposit gold onto the surface of this semiconductor layer to form a source electrode and a drain electrode. In this way, an organic transistor device was fabricated wherein the film thickness of the source electrode and the drain electrode was 300 nm, the channel width (W) was 5 mm, and the channel length (L) was 20 μm.

Comparative Examples 1 to 3

Instead of the compound of the invention, compounds A to C illustrated below were each used as an organic semiconductor material to produce organic transistor devices independently in the same way as in Example 1. The used compound C had a weight-average molecular weight of 48,300 (in terms of polystyrene, GPC).

[Chemical formula 9]

Compound A

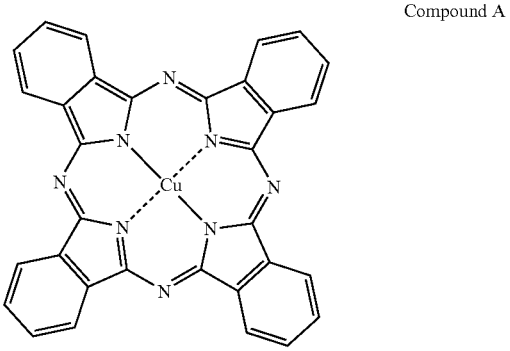

-continued

[Chemical formula 10]

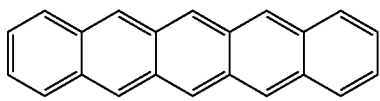

Compound B

[Chemical formula 11]

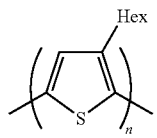

Compound C

The organic transistor devices produced as described above were each used, and the transistor device was stored at 40° C. in the atmosphere. Changes in the transistor characteristic of the device with the passage of time were compared. A voltage of 30 V or −30 V was applied between the source electrode and the drain electrode, and a sweep of voltages ranging from 50 to −50 V was made onto the gate electrode. The ratio of the maximum current value (ON current) between the source electrode and the drain electrode at this time to the minimum current value (OFF current) was defined as the ON/OFF ratio. About each of the devices, the ON/OFF ratio just after the formation of the device was regarded as one. In this case, the relative value of the ON/OFF ratio after one day, that after one week, and that after one month are as described below.

TABLE 1

| Element No. | Organic semiconductor material | Semiconductor layer manufacturing method | Relative value of the ON/OFF ratio | | |
|---|---|---|---|---|---|
| | | | One day later | One week later | One month later |
| 1 | Compound(1) | Dry process | 0.99 | 0.94 | 0.92 |
| 2 | Compound(2) | Dry process | 0.97 | 0.93 | 0.93 |
| 3 | Compound(4) | Dry process | 0.94 | 0.95 | 0.93 |
| 4 | Compound(5) | Dry process | 0.93 | 0.88 | 0.82 |
| 5 | Compound(6) | Dry process | 0.94 | 0.87 | 0.80 |
| 6 | Compound(7) | Dry process | 0.98 | 0.92 | 0.90 |
| 7 | Compound(9) | Dry process | 0.99 | 0.96 | 0.94 |
| 8 | Compound(10) | Dry process | 0.94 | 0.88 | 0.81 |
| 9 | Compound(11) | Dry process | 0.98 | 0.94 | 0.91 |
| 10 | Compound(12) | Dry process | 0.94 | 0.91 | 0.83 |
| 11 | Compound(13) | Dry process | 0.96 | 0.89 | 0.87 |
| 12 | Compound(15) | Dry process | 0.99 | 0.97 | 0.97 |
| 13 | Compound(17) | Dry process | 0.96 | 0.92 | 0.89 |
| 14 | Compound(19) | Dry process | 0.97 | 0.93 | 0.91 |
| 15 | Compound(19) | Wet process | 0.93 | 0.91 | 0.88 |
| 16 | Compound(21) | Dry process | 0.96 | 0.87 | 0.82 |
| 17 | Compound(24) | Dry process | 0.93 | 0.84 | 0.80 |
| 18 | Compound(27) | Dry process | 0.97 | 0.89 | 0.88 |
| 19 | Compound(28) | Dry process | 0.98 | 0.93 | 0.90 |
| 20 | Compound(30) | Dry process | 0.97 | 0.94 | 0.91 |
| 21 | Compound(33) | Dry process | 0.99 | 0.97 | 0.92 |
| 22 | Compound(33) | Wet process | 0.97 | 0.91 | 0.87 |
| 23 | Compound(36) | Dry process | 0.96 | 0.84 | 0.81 |
| 24 | Compound(41) | Dry process | 0.98 | 0.95 | 0.90 |
| 25 | Compound(42) | Dry process | 0.94 | 0.95 | 0.93 |
| 26 | Compound(45) | Dry process | 0.96 | 0.91 | 0.88 |
| 27 | Compound(46) | Dry process | 0.99 | 0.93 | 0.91 |
| 28 | Compound(46) | Wet process | 0.94 | 0.91 | 0.89 |
| 29 | Compound(47) | Dry process | 0.96 | 0.92 | 0.89 |
| 30 | Compound(47) | Wet process | 0.94 | 0.91 | 0.87 |
| 31 | Compound(51) | Dry process | 0.96 | 0.92 | 0.89 |
| 32 | Compound(52) | Dry process | 0.96 | 0.97 | 0.95 |
| 33 | Compound(53) | Dry process | 0.97 | 0.91 | 0.87 |
| 34 | Compound(57) | Dry process | 0.96 | 0.88 | 0.82 |
| 35 | Compound(59) | Dry process | 0.90 | 0.84 | 0.83 |
| 36 | Compound(60) | Dry process | 0.97 | 0.93 | 0.92 |
| 37 | Compound(60) | Wet process | 0.94 | 0.90 | 0.89 |
| 38 | Compound(61) | Wet process | 0.97 | 0.93 | 0.92 |
| 39 | Compound(63) | Wet process | 0.94 | 0.88 | 0.82 |
| 40 | Compound(64) | Dry process | 0.97 | 0.92 | 0.89 |
| 41 | Compound(66) | Dry process | 0.96 | 0.91 | 0.90 |
| 42 | Compound(66) | Wet process | 0.96 | 0.89 | 0.87 |
| 43 | Compound(67) | Wet process | 0.98 | 0.90 | 0.87 |
| 44 | Compound(68) | Wet process | 0.96 | 0.91 | 0.90 |
| 45 | Compound(69) | Wet process | 0.98 | 0.93 | 0.91 |
| 46 | Compound(70) | Dry process | 0.97 | 0.90 | 0.90 |
| Comparative Example 1 | Compound A | Dry process | 0.88 | 0.63 | 0.41 |
| Comparative Example 2 | Compound B | Dry process | 0.89 | 0.43 | 0.22 |
| Comparative Example 3 | Compound C | Wet process | 0.90 | 0.34 | 0.30 |

Comparative Example

According to Table 1, it is understood that the organic transistor devices for an active layer produced by the use of the semiconductor material of the invention also exhibit high stability over time in the atmosphere.

Example 2

Compounds represented by the general formula [3] were each used as an organic semiconductor material to produce organic transistor devices 47 to 81 independently as follows:

First, Synthesis examples in the invention are described below. Symmetric ones out of the exemplified compounds can be synthesized by, for example, synthesis methods disclosed in the specification of U.S. Pat. No. 4,579,949.

Synthesis Example 1

18.4 g of dimethyl succinate, 53.1 g of 4-trifluoromethylbenzonitrile, and 25.3 g of sodium butoxide were dissolved into 200 g of amyl alcohol, and then the solution was refluxed for 8 hours. The solution was cooled, and then the precipitation was filtrated and washed with acetic acid and methanol to yield 21.2 g of an exemplified compound (105). By mass spectrometry based on MALDITOF-MS (autoflex II, manufactured by Bruker Daltonics Inc.), the result was consistent with the molecular weight (Calcd.: 424.06, Found: 423.88) of the compound (105).

Synthesis Example 2

An exemplified compound (116) was yielded in the same way as in Synthesis Example 1 except that 4-fluorobenzonitrile was used instead of 4-trifluoromethylbenzonitrile. By mass spectrometry based on MALDITOF-MS, the result was consistent with the molecular weight (Calcd.: 324.07, Found: 324.25) of the compound (116).

Synthesis Example 3

An exemplified compound (121) was yielded in the same way as in Synthesis Example 1 except that 3,5-difluorobenzonitrile was used instead of 4-trifluoromethylbenzonitrile. By mass spectrometry based on MALDITOF-MS, the result was consistent with the molecular weight (Calcd.: 360.05, Found: 360.38) of the compound (121).

Synthesis Example 4

An exemplified compound (131) was yielded in the same way as in Synthesis Example 1 except that 3-chloro-4-methylbenzonitrile was used instead of 4-trifluoromethylbenzonitrile. By mass spectrometry based on MALDITOF-MS, the result was consistent with the molecular weight (Calcd.: 384.04, Found: 384.33) of the compound (131).

Asymmetric ones out of the exemplified compounds can be synthesized by, for example, a synthesis method disclosed in Tetrahydron, 2002, vol. 58, p. 5547, or Japanese Patent Application Laid-Open No. 7-21122.

Synthesis Example 5

2.0 g of a compound D illustrated below, 1.8 g of 4-trifluoromethylbenzonitrile, and 1.8 g of sodium butoxide were dissolved into 50 g of amyl alcohol, and then the solution was refluxed for 8 hours. The solution was cooled, and then acetic acid was added thereto. The solution was stirred for 30 minutes, and then the precipitation was filtrated and washed with acetic acid and methanol to yield 1.6 g of an exemplified compound (108). By mass spectrometry based on MALDITOF-MS, the result was consistent with the molecular weight (Calcd.: 356.08, Found: 356.83) of the compound (108).

Compound D

[Chemical formula 12]

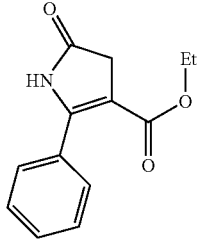

The compound D was synthesized in accordance with a synthesis method disclosed in Synthetic Communication, 1988, vol. 18, p. 1213, Tetrahedron, 2002, vol. 58, p. 5547, or Japanese Patent Application Laid-Open No. 7-53711.

Synthesis Example 6

An exemplified compound (106) was yielded in the same way as in Synthesis Example 5 except that 2,3,4,5,6-pentafluorobenzonitrile was used instead of 4-trifluoromethylbenzonitrile. By mass spectrometry based on MALDITOF-MS, the result was consistent with the molecular weight (Calcd.: 378.04, Found: 378.09) of the compound (106).

Next, the above-mentioned compounds and others were each used as an organic semiconductor material to produce organic transistor devices independently by the following two methods:

(1) Formation Method at a Low Vapor-Deposition Rate

Specifically, a thermally oxidized layer was formed as a gate insulating layer on a Si wafer having a resistivity of 0.02 Ωcm as a gate electrode. Thereafter, the resultant was surface-treated with hexamethyldisilazane (HMDS). Moreover, a glass substrate surface-treated with hexamethyldisilazane (HMDS) was prepared for retardation-measurement. By vacuum vapor-deposition (vacuum pressure: $2.2 \times 10^{-6}$ Torr, vapor-deposition rate: 0.01 to 0.02 nm/sec), some compounds shown in Table 2 were each stacked thereon into a thickness of 110 nm. Furthermore, a mask was used to vapor-deposit gold onto the surface of the film on the Si wafer to form a source electrode and a drain electrode. In this way, each of organic transistor devices 47 to 72 was produced wherein the film thickness of the source electrode and the drain electrode was 300 nm, the channel width (W) was 3 mm, and the channel length (L) was 25 μm.

(2) Formation at a High Vapor-Deposition Rate

Some organic semiconductor materials shown in Table 2 were each used to produce organic transistor devices 73 to 81 independently in the same way as in the formation method at the low vapor-deposition rate except that the average vapor-deposition rate in the vacuum vapor-deposition was set into the range of 1.3 to 1.5 nm/sec.

Comparative Examples 4 and 5

The compound B used in Comparative Example 2 was used as an organic semiconductor material to produce organic transistor devices by two methods, wherein the vapor-deposition rate was varied, respectively (Comparative Example 4: the vapor-deposition rate was from 0.01 to 0.02 nm/sec; and Comparative Example 5: the vapor-deposition rate was from 1.3 to 1.5 nm/sec).

The organic transistor devices produced as described were each used, and the transistor device was stored at 60° C. in the atmosphere. Changes of the transistor characteristic of the device with the passage of time were compared. A voltage of 50 V or −50 V was applied between the source electrode and the drain electrode, and a sweep of voltages ranging from 50 to −50 V was made onto the gate electrode. The ratio of the maximum current value (ON current) between the source electrode and the drain electrode at this time to the minimum current value (OFF current) therebetween was defined as the ON/OFF ratio. About each of the devices, the ON/OFF ratio just after the formation of the device was regarded as one. In this case, the relative value of the ON/OFF ratio after one day, that after one week, and that after one month are as shown in Table 2.

Next, the glass substrates formed for the device numbers 47 to 81 in Example 2, and the glass substrates in Comparative Examples 4 and 5 were each used to measure the retardation in the wavelength range of 400 to 700 nm by means of an ellipsometer (M-220, manufactured by JASCO Corp.).

Figure 2:
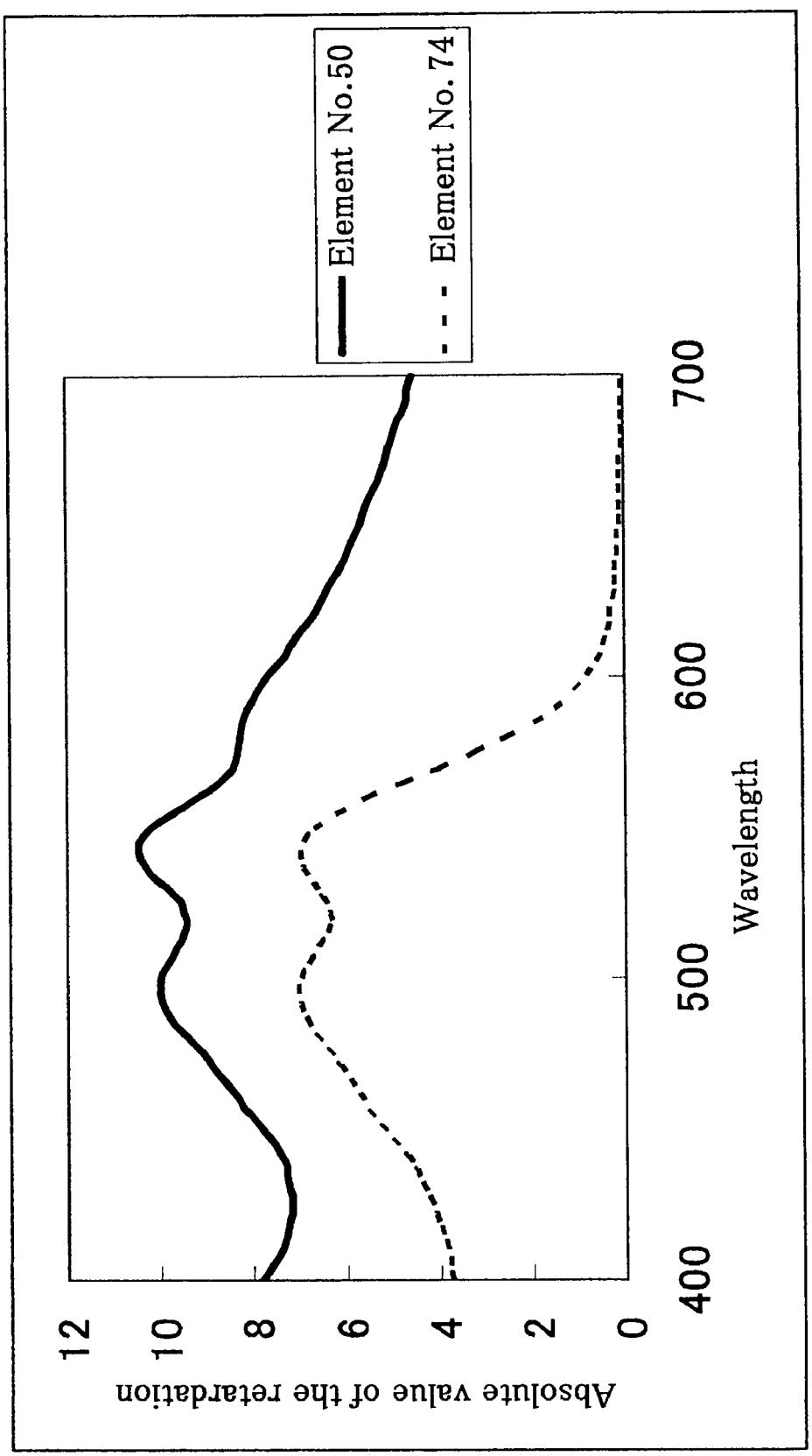
FIG. 2 is a graph showing an example of the relationship between wavelength and the absolute value of retardation.

One example of the measurement results is shown in FIG. 2 in case of the compound 108 (the device numbers 50 to 74 in Example 2). According to FIG. 2, a remarkable difference was shown at a longer wavelength side (at about 600 to 700 nm) from the absorption end of the compound. In case of the device number 74, the absolute value of the retardation was about zero; however, in case of the device number 50, a value of 4 to 8 degrees was shown. The difference has not been made clear; however, it appears that the difference was probably based on the arrangement of the compound or the order of the arrangement in the vapor-deposited film. In Table 2, "Absolute value (degrees) of the retardation" represents the value at 650 nm, where the compound exhibited no absorption.

TABLE 2

| Element No. | Organic Semiconductor material | Absolute value of the retardation (degrees) | Relative value of the ON/OFF ratio | | |
|---|---|---|---|---|---|
| | | | One day later | 7 days later | 30 days later |
| 47 | Compound(101) | 6.22 | 0.98 | 0.92 | 0.92 |
| 48 | Compound(105) | 5.89 | 0.97 | 0.94 | 0.91 |
| 49 | Compound(106) | 5.99 | 0.97 | 0.91 | 0.87 |
| 50 | Compound(108) | 5.69 | 0.98 | 0.93 | 0.89 |
| 51 | Compound(113) | 5.22 | 1.00 | 0.92 | 0.88 |
| 52 | Compound(117) | 6.34 | 0.95 | 0.89 | 0.90 |
| 53 | Compound(133) | 3.22 | 0.91 | 0.85 | 0.82 |
| 54 | Compound(138) | 8.33 | 0.97 | 0.91 | 0.90 |
| 55 | Compound(146) | 6.22 | 0.98 | 0.90 | 0.86 |
| 56 | Compound(156) | 2.28 | 0.92 | 0.84 | 0.81 |
| 57 | Compound(172) | 3.09 | 0.91 | 0.87 | 0.80 |
| 58 | Compound(178) | 2.55 | 0.93 | 0.83 | 0.82 |
| 59 | Compound(180) | 5.27 | 0.96 | 0.90 | 0.89 |
| 60 | Compound(184) | 6.53 | 0.99 | 0.90 | 0.87 |
| 61 | Compound(190) | 4.96 | 0.92 | 0.88 | 0.81 |
| 62 | Compound(191) | 3.11 | 0.92 | 0.84 | 0.82 |
| 63 | Compound(200) | 5.38 | 0.96 | 0.91 | 0.91 |
| 64 | Compound(203) | 6.77 | 0.97 | 0.88 | 0.86 |
| 65 | Compound(205) | 5.24 | 0.98 | 0.90 | 0.89 |
| 66 | Compound(222) | 6.38 | 0.97 | 0.91 | 0.86 |
| 67 | Compound(226) | 5.82 | 0.96 | 0.93 | 0.90 |
| 68 | Compound(236) | 5.36 | 0.98 | 0.89 | 0.86 |
| 69 | Compound(239) | 6.85 | 0.98 | 0.88 | 0.85 |
| 70 | Compound(242) | 5.68 | 0.96 | 0.92 | 0.89 |
| 71 | Compound(252) | 6.85 | 0.97 | 0.93 | 0.90 |
| 72 | Compound(254) | 5.24 | 0.96 | 0.95 | 0.96 |
| 73 | Compound(104) | 0.54 | 0.92 | 0.76 | 0.67 |
| 74 | Compound(108) | 0.13 | 0.80 | 0.68 | 0.40 |
| 75 | Compound(124) | 0.17 | 0.96 | 0.79 | 0.71 |
| 76 | Compound(130) | 0.51 | 0.93 | 0.79 | 0.76 |
| 77 | Compound(139) | 0.82 | 0.92 | 0.74 | 0.59 |
| 78 | Compound(190) | 0.39 | 0.93 | 0.80 | 0.64 |
| 79 | Compound(228) | 0.42 | 0.91 | 0.77 | 0.60 |
| 80 | Compound(229) | 0.73 | 0.96 | 0.82 | 0.72 |
| 81 | Compound(242) | 0.69 | 0.92 | 0.78 | 0.64 |
| Comparative Example 4 | Compound B | 2.64 | 0.91 | 0.56 | — |
| Comparative Example 5 | Compound B | 1.02 | 0.89 | 0.33 | — |

In the table, the symbol "---" means that the compounds were not driven as a transistor. Each of the retardations was measured by the use of the "M-220" manufactured by JASCO Corp.

In the device numbers 47 to 72 shown in Table 2, the absolute value of the retardation was 1 degree or more. On the other hand, in the device numbers 73 to 81, the absolute value of the retardation was 1 degree or less. This was affected by the difference in the vapor-deposition rate. The device numbers 47 to 72 are recognized to have higher relative values of ON/OFF ratio after 30 days and an excellent stability over time comparing to the device numbers 73 to 81.

Furthermore, it has been understood that Comparative Examples 4 and 5 were not driven as a transistor after 30 days. These semiconductor thin films were not a uniform film, and a phenomenon such as aggregation was caused in their surfaces.

As described above, in a case where organic semiconductor materials known in the prior art stand still in the atmosphere, thin films therefrom are doped with oxygen or the like, so that characteristics thereof deteriorate. It is known that the compounds themselves start to deteriorate in some cases. However, it is understood that any organic transistor device produced by the use of the semiconductor material of the invention in its active layer exhibits a high stability over time in the atmosphere also.

The invention claimed is:

1. An organic transistor having a source electrode, a drain electrode, a gate electrode, and an organic semiconductor layer, wherein the organic semiconductor layer comprises a compound represented by general formula [1]:

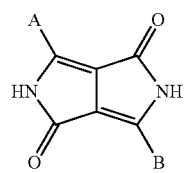

[1]

wherein A and B each independently represent a substituted alkyl group, an unsubstituted alkyl group, a substituted heterocyclic group, an unsubstituted heterocyclic group, a substituted aryl group, or an unsubstituted aryl group.

2. The organic transistor according to claim 1, wherein A and B are independently represented by general formula [2]:

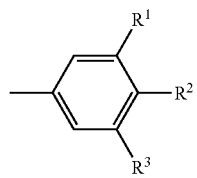

[2]

wherein $R^1$ to $R^3$ each independently represent a hydrogen atom, a halogen atom, a substituted alkyl group, an unsubstituted alkyl group, a substituted heterocyclic ring, an unsubstituted heterocyclic ring, a substituted aryl group, unsubstituted aryl group, a substituted alkoxy group, an unsubstituted alkoxy group, a substituted heterocyclic oxy group, an unsubstituted heterocyclic oxy group, a substituted aryloxy group, an unsubstituted aryloxy group, an alkylthio group, an arylthio group, a heterocyclic thio group, an alkylsulfonyl group, an arylsulfonyl group, a heterocyclic sulfonyl group, a substituted amino group, or an unsubstituted amino group; and substituents of $R^1$ to $R^3$ may be bonded to each other to form a cycloalkyl ring, a heterocyclic ring, or an aromatic hydrocarbon ring.

3. The organic transistor according to claim 1, comprising the source electrode, the drain electrode, the gate electrode, and the organic semiconductor layer, wherein the organic semiconductor layer is formed by vacuum vapor-deposition at a vapor-deposition rate of 1 nm/sec or less.

4. The organic transistor according to claim 1, further comprising a gate insulating film.

5. An organic transistor comprising a source electrode, a drain electrode, a gate electrode, and an organic semiconductor layer, wherein the organic semiconductor layer comprises a compound represented by general formula [3]:

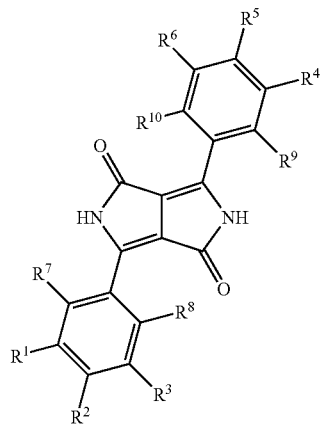

[3]

wherein $R^1$ to $R^{10}$ are each independently a hydrogen atom, a halogen atom, an alkyl group which has 4 or less carbon atoms, an alkyl group which has 4 or less carbon atoms that is substituted with a halogen atom, an alkoxy group which has 4 or less carbon atoms, an alkoxy group which has 4 or less carbon atoms that is substituted with a halogen atom, an amino group which has 4 or less carbon atoms, an amino group which has 4 or less carbon atoms that is substituted with a halogen atom, a nitro group, or a cyano group, and the compound contains at least one halogen atom.

6. The organic transistor according to claim 5, wherein $R^7$ to $R^{10}$ are independently a hydrogen atom or a halogen atom.

7. The organic transistor according to claim 5, wherein the halogen atom is a fluorine atom.

8. The organic transistor according to claim 5, comprising the source electrode, the drain electrode, the gate electrode, and the organic semiconductor layer, wherein the organic semiconductor layer is formed by vacuum vapor-deposition at a vapor-deposition rate of 1 nm/sec or less.

9. The organic transistor according to claim 5, further comprising a gate insulating film.

10. A process for producing an organic transistor comprising a source electrode, a drain electrode, a gate electrode, and an organic semiconductor layer, comprising subjecting a compound represented by general formula [1] or [3] to vacuum vapor-deposition or spin coating, to form an organic semiconductor layer

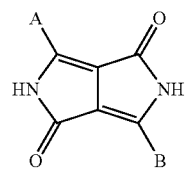

[1]

wherein A and B independently represent a substituted alkyl group, an unsubstituted alkyl group, a substituted heterocyclic group, an unsubstituted heterocyclic group, a substituted aryl group, or an unsubstituted aryl group

[3]

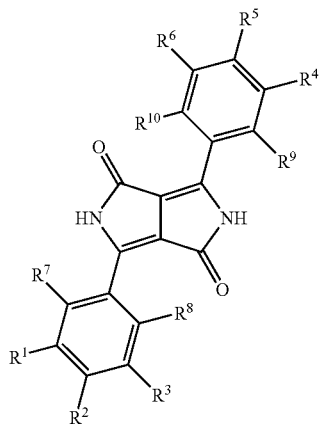

wherein $R^1$ to $R^{10}$ are independently a hydrogen atom, a halogen atom, an alkyl group which has 4 or less carbon atoms, an alkyl group which has 4 or less carbon atoms that is substituted with a halogen atom, an alkoxyl group which has 4 or less carbon atoms, an alkoxy group which has 4 or less carbon atoms that is substituted with a halogen atom, an amino group which has 4 or less carbon atoms, an amino group which has 4 or less carbon atoms that is substituted with a halogen atom, a nitro group, or a cyano group, and the compound contains at least one halogen atom.

11. The process for producing an organic transistor according to claim 10, wherein the organic semiconductor layer is formed by the vacuum vapor-deposition wherein the rate of the vapor-deposition is set to 1 nm/sec or less.

* * * * *